US007010451B2

(12) United States Patent
Dorough et al.

(10) Patent No.: US 7,010,451 B2
(45) Date of Patent: Mar. 7, 2006

(54) DYNAMIC CREATION AND MODIFICATION OF WAFER TEST MAPS DURING WAFER TESTING

(75) Inventors: Michael J. Dorough, Meridian, ID (US); Robert M. Gravelle, Boise, ID (US); Sergey A. Velichko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 10/417,640

(22) Filed: Apr. 17, 2003

(65) Prior Publication Data

US 2004/0210413 A1    Oct. 21, 2004

(51) Int. Cl.
*G01R 31/26* (2006.01)
*H01L 21/66* (2006.01)

(52) U.S. Cl. .................. 702/117; 438/14; 382/145; 324/765; 716/4

(58) Field of Classification Search .............. 324/765, 324/754, 769, 158.1; 438/5, 10, 14, 17; 716/1, 4; 382/145; 702/117, 118
See application file for complete search history.

(56) References Cited

U.S. PATENT DOCUMENTS

| 4,639,664 A | 1/1987 | Chiu et al. ............. 324/73 AT |
| 4,656,632 A | 4/1987 | Jackson ..................... 371/20 |
| 4,896,269 A | 1/1990 | Tong |
| 4,985,988 A | 1/1991 | Littlebury .................. 29/827 |
| 5,059,899 A * | 10/1991 | Farnworth et al. .......... 438/18 |
| 5,078,257 A | 1/1992 | Carter, Jr. |
| 5,088,045 A | 2/1992 | Shimanaka et al. |
| 5,177,688 A | 1/1993 | Rentschler et al. |
| 5,206,582 A | 4/1993 | Ekstedt et al. ............ 324/73.1 |
| 5,241,266 A | 8/1993 | Ahmad et al. ............. 714/733 |
| 5,360,747 A | 11/1994 | Larson et al. |
| 5,457,400 A | 10/1995 | Ahmad et al. ............. 324/763 |
| 5,483,175 A | 1/1996 | Ahmad et al. ............. 438/18 |
| 5,615,138 A | 3/1997 | Tanaka et al. |
| 5,726,920 A | 3/1998 | Chen et al. ................ 702/108 |
| 5,787,190 A * | 7/1998 | Peng et al. ................ 382/145 |
| 5,806,181 A | 9/1998 | Khandros et al. |
| 5,822,717 A | 10/1998 | Tsiang et al. .............. 702/108 |
| 5,845,234 A | 12/1998 | Testa et al. ................ 702/119 |
| 5,869,974 A | 2/1999 | Akram et al. .............. 324/754 |

(Continued)

OTHER PUBLICATIONS

Blunn, R G., "Concurrent fault tolerant control of semiconductor measurement and testing", *2001 IEEE International Semiconductor Manufacturing Symposium*, (Oct. 8-10, 2001), pp. 455-458.

(Continued)

*Primary Examiner*—Carol S. W. Tsui
*Assistant Examiner*—Paul Kim
(74) *Attorney, Agent, or Firm*—Schwegman, Lundberg, Woessner & Kluth, P.A.

(57) ABSTRACT

Methods, systems, and apparatuses provide dynamic creation and modification of wafer test maps. Test plans are defined for a testing session of a wafer lot. The test plan is associated with a number of seed map patterns. During a wafer lot testing session, test results are dynamically obtained and examined at run-time of a test. Moreover, the seed map patterns are overlaid on the test sites defined in the test plan. If the test result statistics are outside of defined threshold tolerance levels, then a new wafer test map is created or modified at run-time, according to corresponding seed map patterns. If seed map patterns are within the intersection of valid test sites, then seed map patterns are created at run-time.

35 Claims, 31 Drawing Sheets

U.S. PATENT DOCUMENTS

| | | | |
|---|---|---|---|
| 5,931,952 A | 8/1999 | Lesmeister | |
| 5,943,230 A | 8/1999 | Rinnen et al. | |
| 5,962,862 A | 10/1999 | Evers et al. | 250/559.4 |
| 6,031,382 A | 2/2000 | Nakaizumi | 324/754 |
| 6,113,646 A | 9/2000 | Holden | 716/4 |
| 6,304,095 B1 | 10/2001 | Miyamoto | 324/765 |
| 6,314,034 B1 | 11/2001 | Sugamori | 365/201 |
| 6,331,783 B1 | 12/2001 | Hauptman | 324/765 |
| 6,362,013 B1 | 3/2002 | Yoshimura | |
| 6,370,487 B1 | 4/2002 | Dorough | |
| 6,383,825 B1 | 5/2002 | Farnworth et al. | 438/14 |
| 6,420,864 B1 | 7/2002 | Abraham et al. | |
| 6,445,199 B1 | 9/2002 | Satya et al. | 324/753 |
| 6,462,575 B1 | 10/2002 | Cram | 324/765 |
| 6,466,314 B1 | 10/2002 | Lehman | |
| 6,486,492 B1 | 11/2002 | Su | 257/48 |
| 6,505,138 B1 | 1/2003 | Leonard | 702/119 |
| 6,507,800 B1 | 1/2003 | Sheu | 702/117 |
| 6,536,006 B1 | 3/2003 | Sugamori | 714/724 |
| 6,549,863 B1 * | 4/2003 | Morinaga | 702/81 |
| 6,556,938 B1 | 4/2003 | Rohrbaugh et al. | 702/117 |
| 6,563,331 B1 * | 5/2003 | Maeng | 324/760 |
| 6,567,770 B1 | 5/2003 | Dorough | |
| 6,590,408 B1 | 7/2003 | Cheng et al. | 324/764 |
| 6,618,682 B1 | 9/2003 | Bulaga et al. | 604/27 |
| 6,624,653 B1 | 9/2003 | Cram | 324/765 |
| 6,629,282 B1 | 9/2003 | Sugamori et al. | 714/734 |
| 6,639,417 B1 | 10/2003 | Takao | 324/765 |
| 6,675,138 B1 | 1/2004 | Hollander et al. | |
| 6,785,413 B1 * | 8/2004 | Barcomb et al. | 382/149 |
| 2002/0000826 A1 | 1/2002 | Takao | 324/765 |
| 2002/0111775 A1 | 8/2002 | Dorough | |
| 2002/0121915 A1 * | 9/2002 | Montull et al. | 324/765 |
| 2002/0152046 A1 | 10/2002 | Velichko et al. | 702/117 |
| 2002/0156548 A1 | 10/2002 | Arackaparambil et al. | |
| 2003/0028343 A1 | 2/2003 | Velichko et al. | 702/122 |
| 2003/0200513 A1 * | 10/2003 | Reuter et al. | 716/4 |
| 2003/0208340 A1 | 11/2003 | Dorough | |
| 2003/0212469 A1 * | 11/2003 | Wang et al. | 700/121 |
| 2003/0212523 A1 | 11/2003 | Dorough et al. | 702/119 |
| 2004/0153979 A1 * | 8/2004 | Chang | 716/4 |

OTHER PUBLICATIONS

Dorough, Michael J., et al., "Dynamic Adaptable Semiconductor Testing", *IEEE Proceedings of the 2002 International Symposium on Semiconductor Manufacturing, ISSM Catalog*, (2002), pp. 1-4.

Sedgewick, R., *Algorithms*, Second Edition, Addison-Wesley Publishing Company, Inc., (1988), pp. 516-519.

* cited by examiner

DYNAMIC CREATION AND MODIFICATION OF WAFER TEST MAPS DURING WAFER TESTING

CROSS REFERENCE TO RELATED APPLICATIONS

The present invention is related pending application Ser. No. 09/834,751, filed Apr. 13, 2001, titled "Concurrent Control of Semiconductor Parametric Testing," which is incorporated herein by reference. The present invention is further related to pending application Ser. No. 10/131,934, filed on Apr. 25, 2002, titled "Intelligent Measurement Modular Semiconductor Parametric Test System," which is incorporated herein by reference. The present invention is also further related to pending application Ser. No. 10/133,685, filed on Apr. 25, 2002, titled "Dynamically Adaptable Semiconductor Parametric Testing," which is incorporated herein by reference.

FIELD OF THE INVENTION

The invention relates generally to testing semiconductors, and more specifically to dynamic creation and modification of wafer test maps during wafer testing.

BACKGROUND OF THE INVENTION

Fabrication of semiconductors typically comprises many steps, including creation of a silicon wafer, deposition of various materials onto the wafer, ion implantation into the wafer, etching away material applied to the wafer, and other similar processes. These processes are used to create the electronic components and connections on the wafer that form a useful electronic circuit.

As these processes are performed on the wafer, the wafer might be subjected to parametric testing. Parametric testing involves testing the electronic parameters of the circuitry on the wafer, such as by applying current or voltage, and by measuring resistance, capacitance, current, voltage, circuitry shapes, circuitry distances, or other such electrical parameters. These tests are used to ensure that a fabricated structure on the semiconductor meets the specifications and requirements of the semiconductor manufacturer and falls within acceptable tolerances.

Parametric testing can take place during the fabrication process to ensure that each stage of fabrication is successful, and is usually performed on the completed wafer to ensure that each completed circuit on the wafer is functional and meets specified performance criteria.

This parametric testing is typically performed with a parametric test system, which is comprised of several parts. Such systems might be capable of loading a wafer from a wafer tray to a wafer chuck, which is then properly alignment under a test pin by a wafer positioner. Once the equipment has properly loaded and positioned the wafer, parametric test instrumentation systems are initialized and operated to apply electrical signals, heat, and other stimuli as needed to the wafer. The test instrumentation also measures parameters, such as impedance and current or voltage measurement, and the test system then analyzes and records the results of the parametric tests.

Although parametric testing is typically used to verify the parameters or performance of production semiconductors, such testing can also be critical in investigating the usability or performance characteristics of new materials or new circuit structures. A wide variety of tests, including resistance, capacitance, transistor characteristic, thermal characteristic, and other tests enable characterization of these new materials and circuits, as well as verification of performance in a production environment.

Testing a single wafer can involve tens of thousands of measurements per wafer, with dozens of wafers per manufacturing lot or wafer tray loaded for test. Because this results in literally millions of parametric tests and measurements that must be performed per wafer lot, the time that such testing requires is an important factor in the productivity of a wafer or semiconductor fabrication facility.

Typically, testing is defined by test maps associated with predefined test plans that are developed by specialized staff, such as semiconductor engineers. Often, these engineers have a wealth of knowledge and experience that is not properly leveraged within an organization. Moreover, their knowledge and experience are often completely lost when engineers leave the organization.

Furthermore, predefined testing sessions are set aside for equipment access, which is required to test a wafer lot. If an engineer detects an area within a wafer that needs more thorough investigation during a testing session, then any additional tests that may be needed are delayed, developed, and processed during a different testing session, and the existing static tests are executed during the allotted testing session. This entire process is time consuming, static, and often unnecessarily duplicated.

For these reasons, there is a need to dynamically operate semiconductor parametric tests on wafers, thereby minimizing the use of development resources and processes during predefined testing sessions. Moreover, tests should be reusable and should enhance existing capabilities that verify performance characteristics of wafer structures under test.

SUMMARY OF THE INVENTION

Methods, Systems, and Apparatuses are provided for dynamic creation and modification of wafer test maps during a single test session. Wafer maps are dynamically created and modified based on initial developed test plans and by overlaying existing geometric patterns onto intersecting test sites, which are identified in the test plans, where test sites within new wafer maps are selectively or randomly chosen or both. The geometric patterns are associated with additional wafer maps. Moreover, wafer maps are created and modified upon parametric measurement values exceeding predefined thresholds or criteria during a testing session. As new wafer maps are developed and associated with geometric patterns, the geometric patterns and concomitant wafer maps are stored in a data repository for future use during other testing sessions.

BRIEF DESCRIPTION OF THE FIGS.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those of ordinary skill in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Figure 1A:
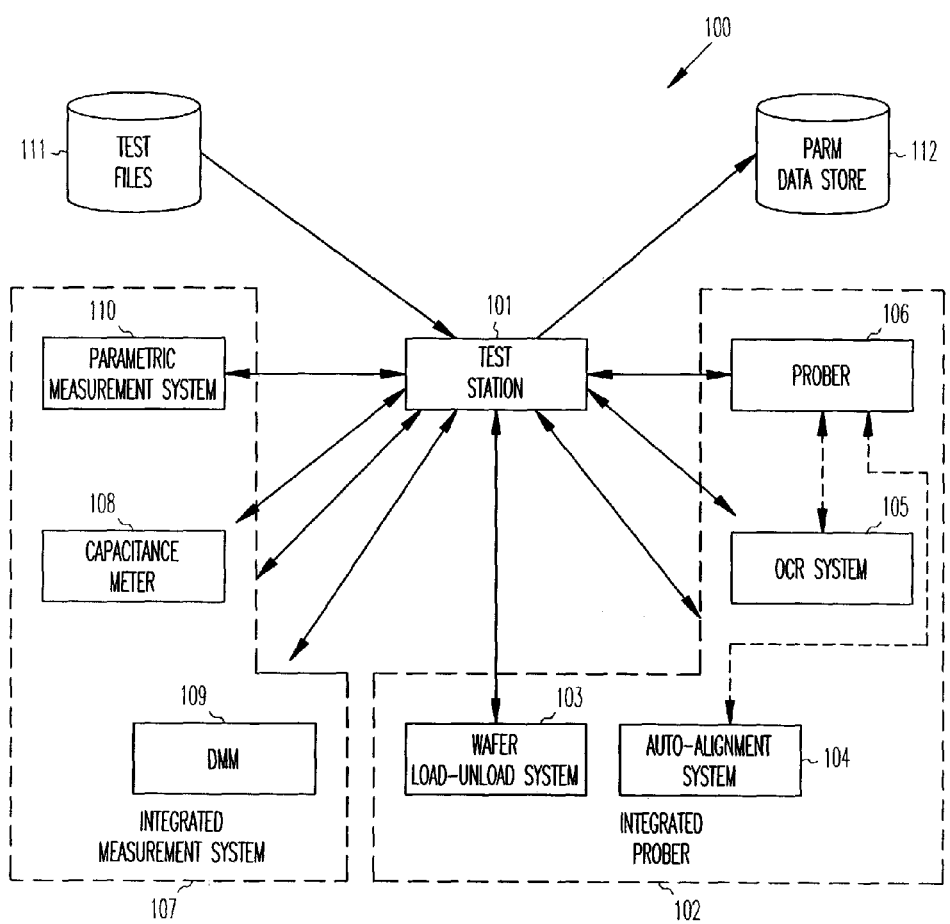
FIG. 1A depicts a block diagram of the components of a dynamic wafer test system, according to one embodiment of the present invention.

FIG. 1A illustrates a dynamic wafer test system 100, according to one embodiment of the present invention. A parametric test system 100 includes a test station 101 connected to an integrated prober 102, which provides wafer movement capability. The integrated prober comprises a wafer loader 103, an auto-alignment system 104 for aligning wafers, an Optical Character Recognition (OCR) system 105, and a prober 106. The prober 106 comprises test pins, as well as a wafer chuck and mover system (not shown in FIG. 1A) that coordinates with the auto-alignment system 104.

The test station 101 is also connected to an integrated measurement system 107, which includes a capacitance meter 108, a digital multimeter (DMM) 109, and a parametric measurement system 110, which are operable to perform measurements and tests.

The test station 101 is also interfaced to test files 111, which store parameters for the wafer under test. These parameters include definitions of the test to be performed on the wafer and of the data to be collected during the wafer tests. Parametric (PARM) data store 112 houses information including the results of the tests, as well as statistics summarizing the test results.

A dynamic wafer test system 100 illustrated in FIG. 1A demonstrates how test instrumentation for one embodiment of the present invention uses an integrated measurement system 107 and an integrated prober system 102. These systems 102 and 107 can be integrated with each other in configurations that are not depicted in FIG. 1A. For example, a wafer chuck of the prober 106 can be heated or cooled by the integrated measurement system 107 or another part of the wafer test system 100. The operation of these various systems is controlled and coordinated by a test station controller 101.

The test station controller 101 can read maps from the test files 111, perform the tests specified in maps on a wafer via the integrated measurement system 107 and integrated prober 102, receive the results of the tests from the integrated measurement system 107, and can record the results in the PARM data store 112. The test station controller 101 includes instructions that are accessible to a machine-readable medium and capable of being executed on a processor. Furthermore, in some embodiments, the test station controller 101 can be implemented in hardware/firmware. The functions of the test station controller 101 can be distributed in the integrated measurement system 107 and/or the integrated prober 102. The functions of the test station controller 101 can also include any control functions of the integrated measurement system 107 and/or the integrated prober 102.

In one embodiment, a Parametric Probe Card Tracking Interface to a Probe Card Tracking System can also be integrated into system 100 in order to reduce probe card costs by optimizing scheduled maintenance of needle cleaning.

Figure 1B:
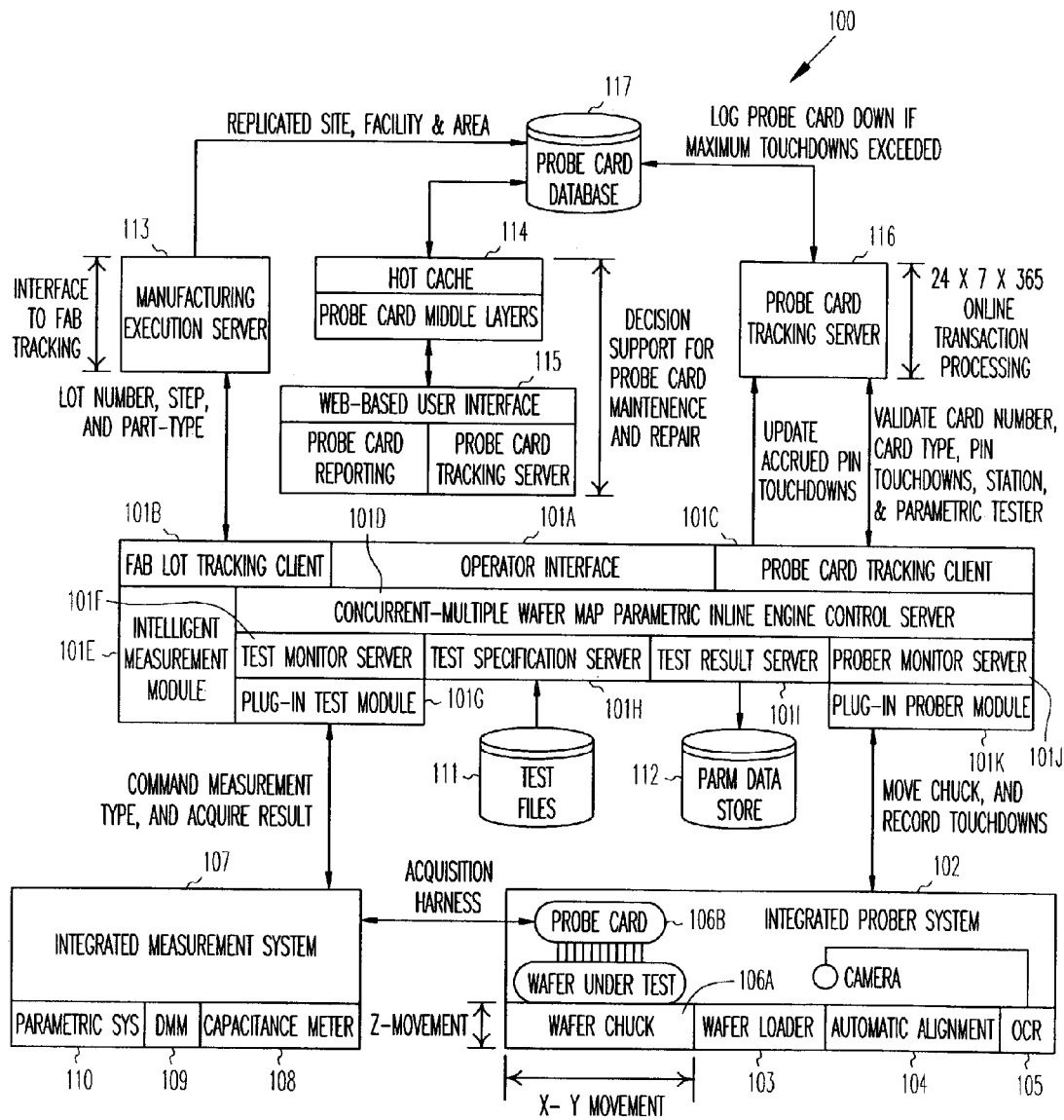
FIG. 1B depicts a block diagram of component detailed view for a wafer test system, according to one embodiment of the present invention.

FIG. 1B illustrates a more detailed view of FIG. 1A that depicts additional components and sub-components of dynamic wafer test system 100, according to one embodiment of the present invention. Moreover, FIG. 1B also depicts various information passing between components of system 100, and logical sub-components of system 100. FIG. 1B is provided as one example configuration for one embodiment for dynamic wafer test system 100 associated with the present invention. Various other configurations of the depicted components can be added, removed, and/or arranged differently. All such permutations are intended to fall within the scope of the present invention.

As shown in FIG. 1B, the test station controller 101 includes an operator interface 101A, a fabrication wafer lot tracking client 101B, a probe card tracking client 101C, a concurrent-multiple wafer inline engine control server (CWE) 101D, an intelligent measurement module 101E, a test monitoring server 101F, a plug-in test module 101G, a test specification server 101H, a test result server 101I, a prober monitor server 101J, and a plug-in prober module 101K.

The CWE 101D dynamically creates new wafer test maps during a lot testing session. Further, the CWE 101D interacts and drives the processing of wafer testing during lot test sessions as a subcomponent module of the test station controller 101. Thus, the CWE 101D acquires a test plan for a wafer lot test session using its test specification server 101H interface in order to load the test plan from a test files data store 111. An operator (e.g., semiconductor engineer) determines a specific test plan to load using the operator interface 101A to interact with the test station controller 101.

The integrated prober system 102 uses its wafer loader 103, automatic alignment 104, OCR 105, wafer chuck 106A, and prober card 106B to acquire an initial wafer under test, manipulate the wafer, and perform operations on the wafer. The prober 106 includes a wafer chuck moving system 106A capable of moving wafers left (X), right (Y), and vertically (Z) within the prober 106.

The CWE 101D communicates acquisition and placement of wafers being tested to the integrated prober system 102 through its prober monitor server 101J. Moreover, confirmation of successful contact or touchdown for a loaded wafer is communicated back to the CWE 101D through the prober monitor server 101J interface. In some embodiments, one or more lower level interfaces (e.g., device drivers) associated with the integrated prober system 102 act as intermediate interfaces between the CWE 101D and the integrated prober system 102 (e.g., plug-in prober module 101K). The integrated prober system 102 then loads, aligns, and scans the wafer being tested, and performs wafer movements according to the test sites and sub site locations specified in the test plans (or maps), requested by the CWE 101D.

Test plans include a number of test locations or wafer sites that are to be testing on wafers in system 100. Moreover, the test plans can include one or more predefined wafer test maps to initially test on the wafer lots. The CWE 101D communicates the sites and desired test operations, identified in the test map of the test plan, to the integrated measurement system 107 through a test monitor server 101F interface. In turn, one or more lower level plug-in interfaces (e.g., device drivers, such as plug-in test module 101G) translate the CWE 101D commands to drive test operations/commands recognized by the integrated measurement system 107.

The integrated measurement system 107 uses its components during a test in order to communicate specific types of test operations for specific wafer sites. The test operations and wafer sites are communicated initially from the CWE 101D through the test monitor server 101F interface and the plug-in test module 101G interfaces. The integrated measurement system 107 performs test operations by applying the tests to the wafer site via the prober 106. Measurements and results acquired by the components of the integrated measurement system 107 are sent back to the CWE 101D through the plug-in test module 101G interfaces and the test monitor server 101F interfaces. Measurements and results are then placed in the intelligent measurement module 101E.

Upon receiving measurement results, the intelligent measurement module 101E dynamically compares the results against predefined threshold values. The results are also recorded in the PARM data store 112 through the test result server 101I interface. If results fall outside a defined tolerance for the threshold values, then the CWE 101D is triggered and can dynamically alter, suspend, and/or initiate a newly created wafer test map using test plans and seeds from the test files data store 111, or any other computer-accessible media. Furthermore, the CWE 101D can inspect the wafer test sites identified in a test plan before or during a lot testing session and overlay a number of predefined geometric patterns on the test sites. The intersection of test sites with a geometric pattern indicates that additional wafer test maps can be created and used during the lot testing session.

Thus, as experienced semiconductor engineers identify geometric patterns associated with previously developed wafer test maps, these maps can be maintained in the test files data store 111, or in any other computer-accessible media. Correspondingly, during any particular lot testing session, the CWE 101D can be configured (e.g., before, during, or after) to evaluate geometric patterns against test sites. If matches occur, newly created wafer test maps are instantiated and communicated appropriately to the integrated measurement system 107, and to the integrated prober 102.

Furthermore, the geometric patterns and the measurement results need not be mutually exclusive conditions with respect to altering, suspending, or creating wafer test maps. In other words, the CWE 101D can be configured to instantiate a newly created or altered wafer test map based on matches (or substantial matches) with geometric patterns and/or based on specific results that are outside a predefined threshold tolerance.

Accordingly, with various embodiments of test system 100, wafer test maps can be dynamically created and/or modified during a given lot testing session. Therefore, the experience of a semiconductor engineer is leveraged, maintained, dynamically acquired, and used when appropriate during a lot testing session through the acquisition and reuse of the wafer test maps, thereby creating an engineering knowledge data store/bank. In this way, wafer testing dynamically proceeds during an allocated lot testing session with more complete, accurate, and efficient tests. Moreover, repetitive tests are avoided, and manual recreation of previous test maps is circumscribed.

In various embodiments, test system 100 also includes additional components, such as a manufacturing execution server 113 that provides monitoring, inventory control, and/or tracking of wafers and/or wafer lots being tested. The CWE 101D interfaces with the manufacturing execution server 113 through the fabrication lot tracking client 101B. Furthermore, inventory control and tracking information can be recorded or replicated in a probe card database 117.

Additionally, in other embodiments, test system 100 includes a probe card tracking server 116 to maintain and support various aspects of the prober cards 106B. The CWE 101D interfaces to the probe card tracking server 116 through its probe card tracking client 101C. Information regarding this tracking, support, maintenance, and the like is also captured and stored in the probe card database 117.

An operator/engineer can interface and direct various reports for purposes of data mining, maintenance, and support of the overall test system 100 through a number of interface applications, such as web-based user interface 115. In turn, for purposes of efficiency and response time, a cache 114 can be used between the user interface 115 and the probe card database 117.

Figure 2:
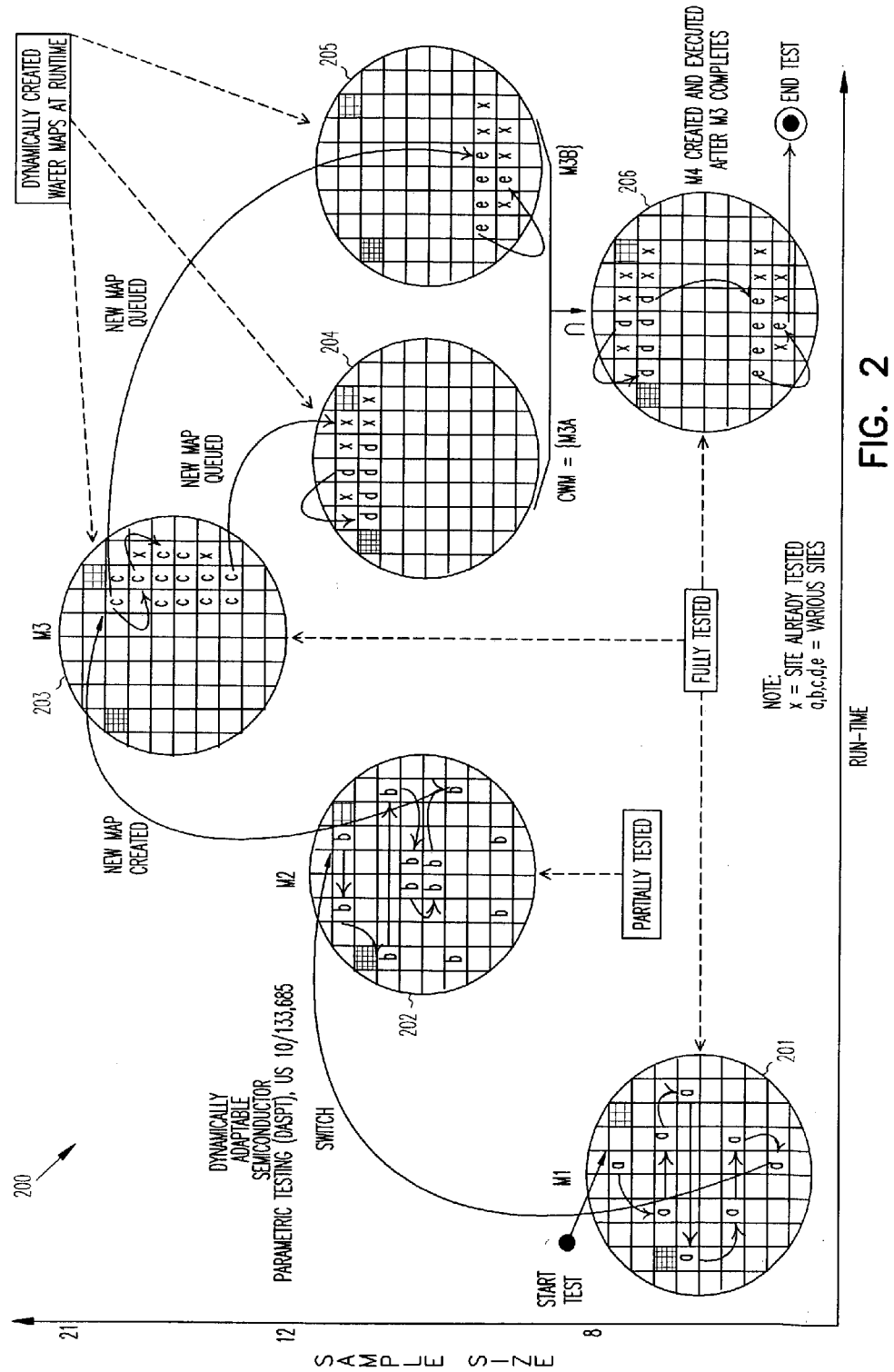
FIG. 2 depicts a sequential run time diagram for newly created prober 106 movement patterns during lot run-time (e.g., testing session), according to one embodiment of the present invention.

FIG. 2 illustrates a diagram 200 of newly created prober 106 movement patterns during lot run-time (e.g., lot testing session), according to one embodiment of the present invention. The prober 106 movement patterns are being dynamically created and instantiated or acquired during the lot testing session, as directed by the test station controller 101. Thus, dynamically created and modified strategic wafer test maps/patterns can be acquired and used to drive the prober 106 movements at lot run-time based on a statistical threshold or other criteria that is not necessarily statistical (e.g., based on business rules or fuzzy logic).

At run-time, a wafer test map is created or modified that can include a new series of test locations/sites on a wafer. This new series of test locations can be obtained from the actual absolute site locations that represent the entire site population specified in the test plan. The newly created wafer map/pattern determines what electrical tests are to execute and where on the wafer the electrical tests are to execute.

For each fabrication facility, there is a limited number of parametric test systems and a limited number of semiconductor experts. In various embodiments of the present invention, a new map/pattern is created at lot run-time the same way the semiconductor engineer, who is cognizant of the part-type specific production issues, would create a unique wafer test map strategy off-line after examining the test results of the wafer lot that had run previously on the parametric test system. Conventionally, the time to re-probe a wafer lot placed on hold takes at least 20 minutes during a testing session and that time is wasted. For example, when an engineer is notified by the parametric inline test system of a problem, the engineer proceeds to prescribe a new wafer test map for a wafer lot on hold. An operator then loads the wafer lot onto the test system and proceeds to re-test. To ensure maximum throughput per parametric test system, this invention, with various described embodiments, makes the most efficient use of allocated test time for each lot under test.

The dynamic creation of a wafer test map occurs while a wafer is still on the test platform, saving time and engineering resources. In other words, the semiconductor engineer does not have to wait for the wafers to finish testing, and avoids re-testing by using a preferred geometric shape to dynamically identify and load any needed wafer test map.

Various embodiments of the present invention seed the dynamic map creation with a preferred geometric shape instantiated from a bank (e.g., a data or knowledge store) of seeds that are sensitive to previous failing site location symptoms for a given part-type and manufacturing step.

The semiconductor engineer, who has a vested interest in the success of the part-type, can select seeds off-line using the test station controller 101 to access the test files data store 111. The seeds are associated with specific test registers.

Examples of seed maps that can be associated with a register include: Single-Site, Center-To-Edge, Edge-Only, Center-Only, Notch-Only, All Testable Sites, Donut and Hourglass, and so on, which are depicted further in FIG. 4 and FIGS. 5A–5D. The actual sites that can be tested are not pre-specified in the test plans stored in the test files 111 and used later by the test station controller 101. Instead, the seed map is used at run-time to form a dynamic wafer test map pattern. Therefore, the new wafer test map pattern is always a subset of valid test sites on the wafer. For example, consider Table 1 that identifies upstream manufacturing process problems related to finding problem geometric shapes:

TABLE 1

| Upstream Process Problems Detected by Inline Parametric Testing | Shape that Finds Problem or would Test Out the Problem |
| --- | --- |
| Over Etched, Under Etched | Donut, Edge-to-Center, Notch-Only, or Half-Moon |
| Implant Problem or Incorrectly Processed | Single-Site |
| Diffusion Furnace Processes, including Poly, Gate Oxide, or Nitride Deposition | All Testable Sites, Edge-Only, Center-To-Edge |
| E-Field or Plasma Processes | Half Moon, Hourglass |
| Photolithography or Etch Process Combination | Edge-Only |
| Residual Poly Feet | Notch-To-Center |
| BPSG Deposition | Center-Only |
| 300 mm | Other Seeded Wafer Map Patterns . . . |

By way of example only, in Table 1, if a lot misses an implant, some of the parametrics may read out of specification at all test locations. Since this can affect the entire wafer fabrication, and testing processes, an engineer wants to determine how many wafers are affected. Thus, all subsequently tested wafers may be tested with a SINGLE-SITE created wafer test map. This can save hours of test and engineering time.

In another example, an engineer might want to determine the effect of an under-etch problem occurring throughout the wafer lot. The engineer may already know that an under-etch problem can propagate from an edge toward a center of the wafer. Accordingly, if a wafer being tested has edge fails, an EDGE-ONLY wafer test map can be created to further investigate the scope of the problem.

Embodiments of the present invention enable wafer test map/patterns to be created dynamically at run-time, which enables semiconductor engineers to better understand upstream manufacturing process problems associated with a particular part-type.

With this background, one can visualize in diagram 200 of FIG. 2 how prober 106 movement patterns or maps are dynamically changed to conduct tests on newly instantiated, created or modified wafer test maps 203–206 during a testing session. Initially, a test plan is used to perform an initial wafer test map 201, at some time thereafter at least some of the second test map can be partially tested 202. In other embodiments, any newly created wafer test maps 203–206 can be delayed until after the initial test maps 201 and 202 completes on the first wafer in the wafer lot.

Thereafter, based on pre-selected seeds associated with the test plan, geometric patterns associated with existing seeds and/or measurement results obtained from a partial test of the second wafer test map 202 are evaluated to dynamically instantiate a number of newly created wafer test maps 203–206. The prober 106 is then instructed to dynamically change patterns or maps and perform tests on test sites defined in the newly created wafer test maps. Finally, in some embodiments, a single composite wafer test map 206 can be generated based on a number of the created wafer test maps 204–205. This composite wafer test map 206 (as well as 203, 204, or 205) can be reused with other lot tests or used for remaining wafers being tested in the wafer lot during a testing session.

Figure 3A:
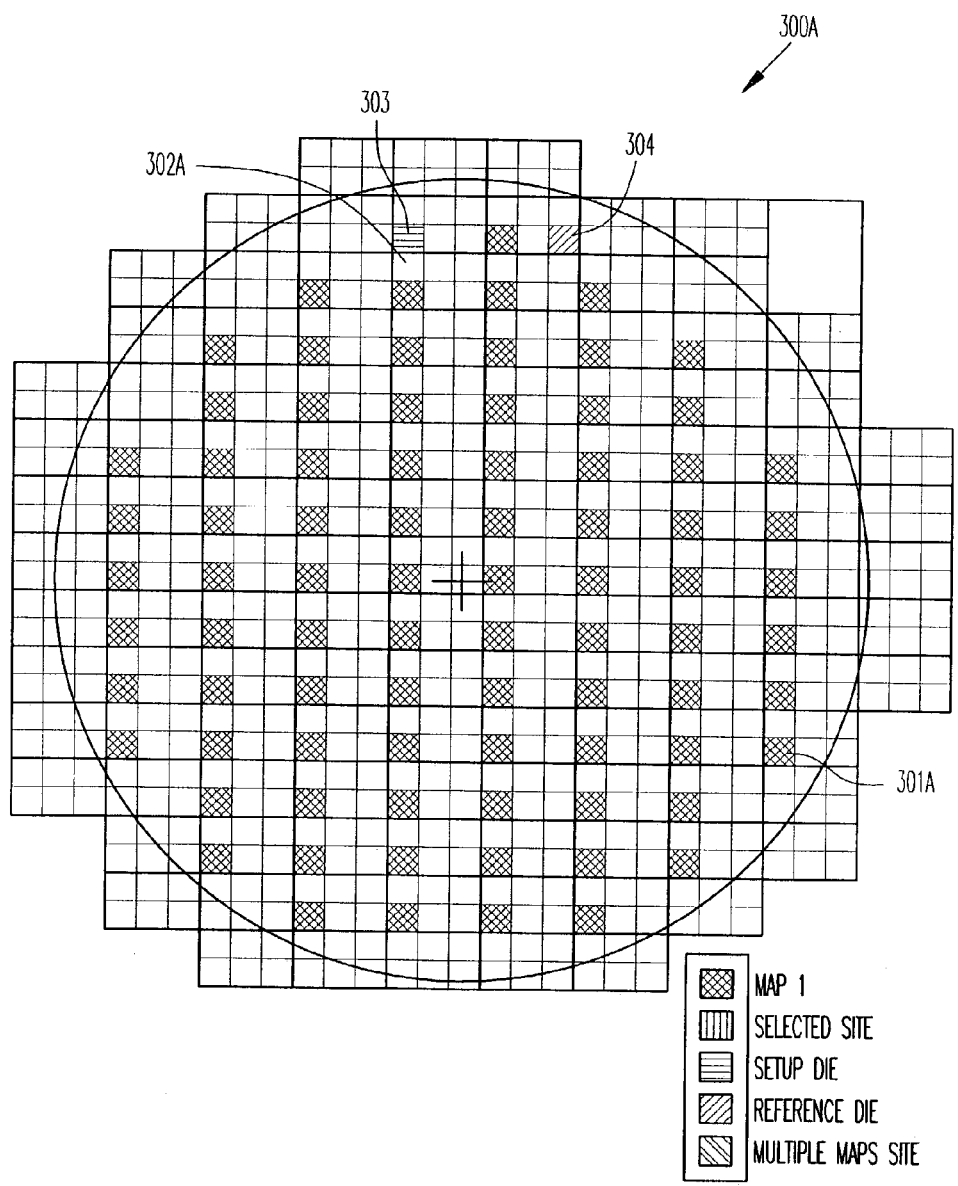
FIG. 3A depicts a diagram representing example wafer test sites that are associated with a wafer test plan, according to one embodiment of the present invention.

FIG. 3A illustrates diagram 300A depicting all possible example test sites on a wafer that are associated with a wafer test plan, according to one embodiment of the present invention.

In order to create new wafer test map/pattern at run-time, all testable sites are defined prior to executing a test. FIG. 3A shows an example site definition for a particular wafer part defined by using a test plan created using sub-modules of the operator interface 101A (or any other editor interface separate and distinct from the operator interface 101A). All site locations 301A are defined in the test plan in order to properly create valid wafer test map patterns that resolve to physical test structures located between dies.

All of the shaded squares of FIG. 3A represent the test sites 301A defined in the test plan for the wafer part under test. A specific selected site for test is identified as 302A, a setup die site is identified as 303, and a reference die site is identified as 303.

Figure 3B:
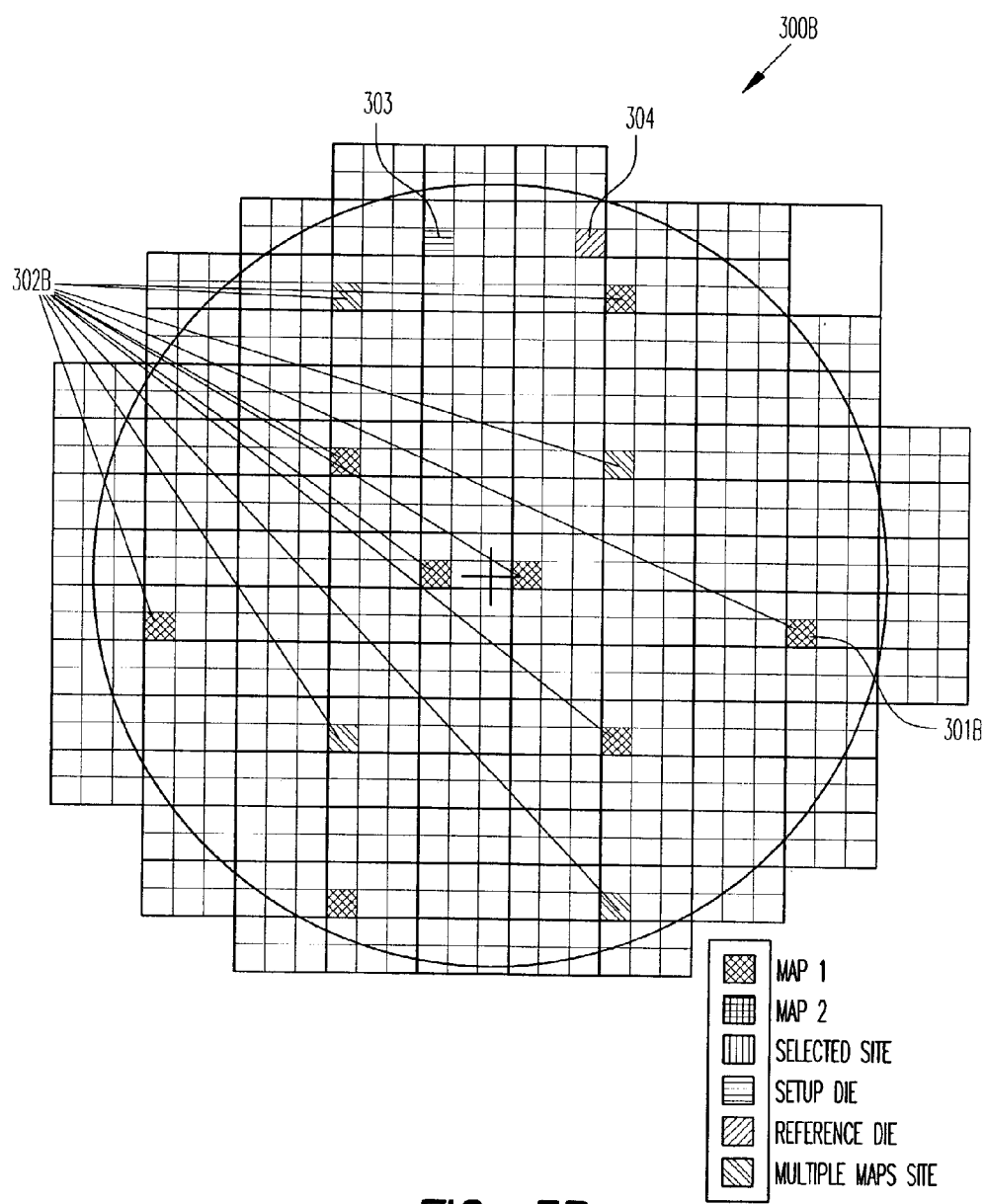
FIG. 3B depicts a diagram representing an example and an initial wafer test map pattern associated with example wafer test sites of FIG. 3A, according to one embodiment of the present invention.

FIG. 3B illustrates a diagram 300B of an example and initial wafer test map pattern associated with a test plan that is to be tested, according to one embodiment of the present invention. Specific test sites that are to be examined, according to the wafer test map pattern, are identified as 303B and currently selected site in the wafer test map pattern is identified as 301B.

Figure 3C:
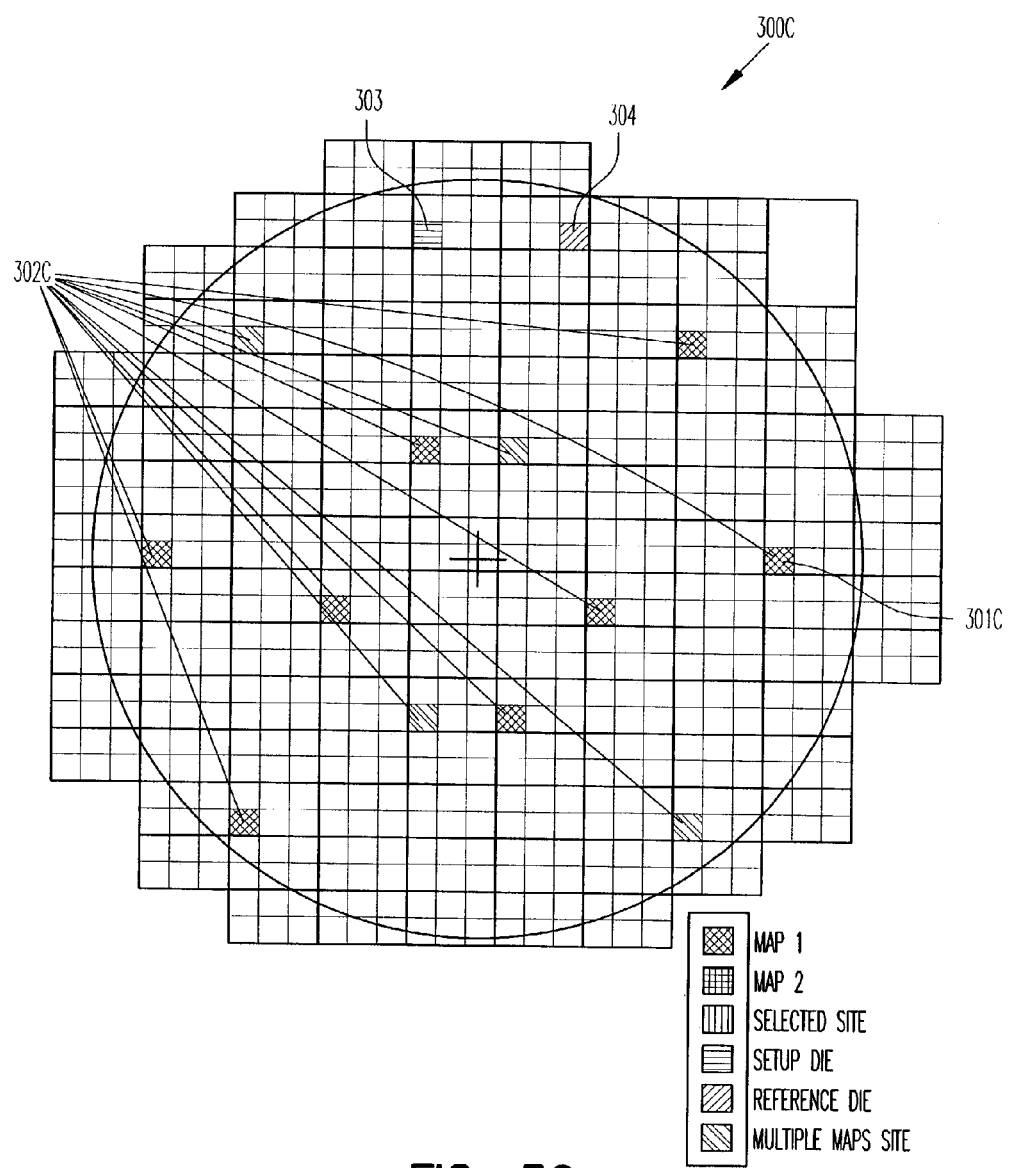
FIG. 3C depicts a diagram representing an example for a dynamically created wafer test map pattern associated with the example test sites of FIG. 3A and selected during the testing of the initial wafer test map pattern of FIG. 3B, according to one embodiment of the present invention.

FIG. 3C illustrates a diagram 300C of an example wafer test map pattern, which is dynamically selected and created during testing of the initial wafer test map pattern identified in FIG. 3B, according to one embodiment of the present invention. Specific test sites that are dynamically determined for examination are identified as 303C, and currently selected site in the wafer test map pattern is identified as 302C. It should be noted that the setup and reference dies may be included in test sites determined for testing.

Conventionally, in order for a semiconductor engineer to shift testing from the initial wafer test map pattern of FIG. 3B to the new wafer test map pattern of FIG. 3C, the engineer would have to perform a number of data store lookups to evaluate parametric lot data that was put on hold in order to run the initial wafer test map pattern of FIG. 3B. It may take the engineer 10 to 15 minutes to complete this evaluation and determine that the wafer test map pattern of FIG. 3C should be used, instead of the initial wafer test map pattern of FIG. 3B. Additionally, the re-probe needed to test the desired wafer test map pattern of FIG. 3C needs to occur during separate wafer lot runs. Running the reprobe wafer test map pattern can require at least another 5 minutes of engineering interaction to set up a second lot run.

Conversely, in various embodiments of the present invention, the wafer test map pattern in FIG. 3C is dynamically created during the lot run, and the initial wafer test map pattern in FIG. 3B is abandoned. Moreover, the wafer test map pattern in FIG. 3C, is a good candidate pattern to be used at run-time when a statistical threshold is exceeded.

The phrase "candidate pattern" indicates that a general area of a re-probe geometric shape is overlaid on the existing site population specified in FIG. 3A. Prior to creating the wafer test map pattern in FIG. 3C, actual site locations associated with the map have not yet been determined. All untested sites or a percentage/random sample of untested sites that fall within boundaries of the new test pattern can be included in the resultant created wafer test map pattern of FIG. 3C. A favorite seed map pattern is selected upon evaluating criteria specified in the test plan. More specifically, a seed map pattern is associated with a test register. Each test register uniquely identifies a kind of parametric measurement.

Figure 4:
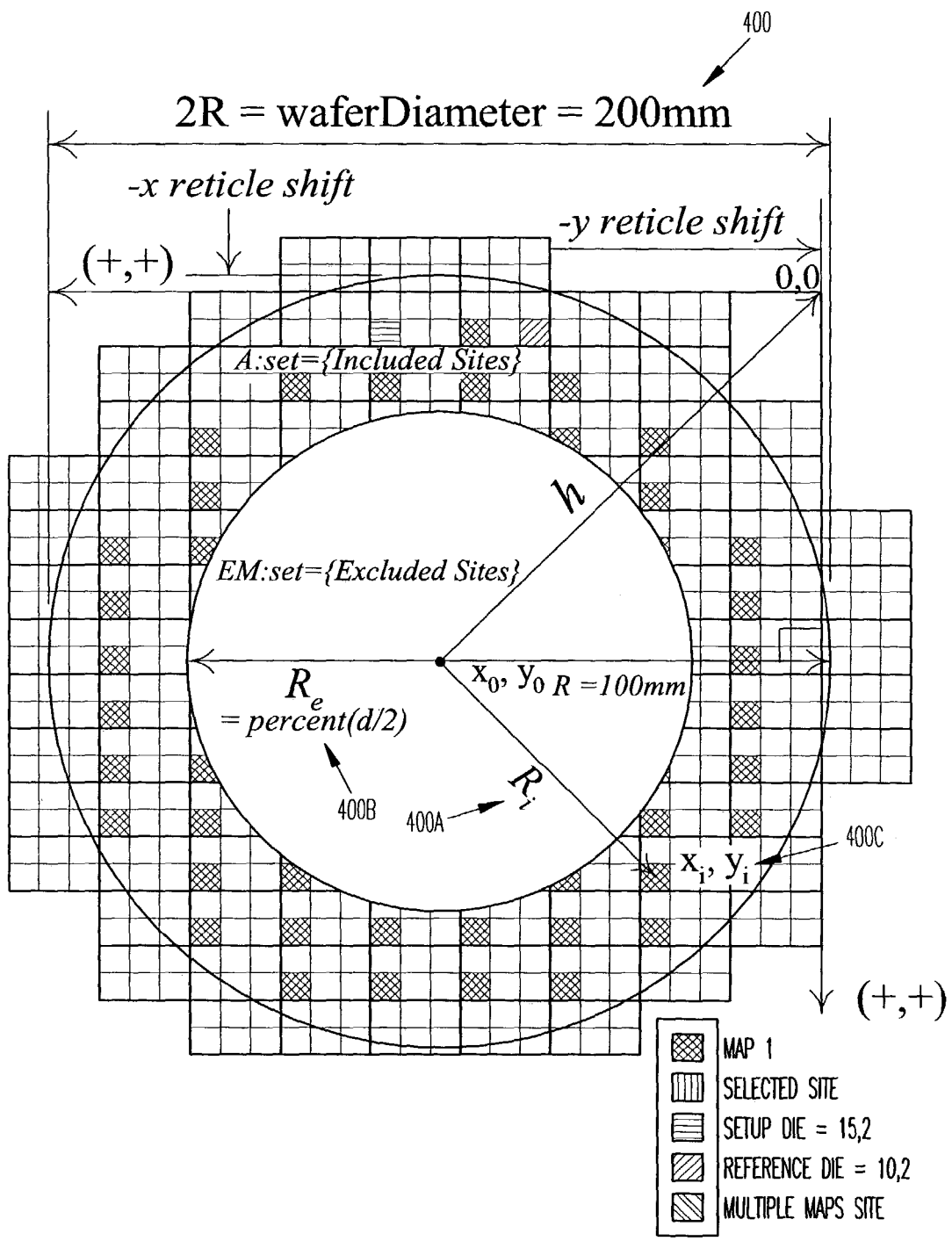
FIG. 4 depicts a pictorial diagram for example dimensions and conditions, which are dynamically identified in a test plan associated with FIG. 3A during testing of the initial wafer test map pattern of FIG. 3B in order to create the wafer test map pattern of FIG. 3C, according to one embodiment of the present invention.

FIG. 4 illustrates a diagram 400 for example dimensions and conditions, which are dynamically identified in a test plan associated with FIG. 3A during testing of the initial wafer test map pattern of FIG. 3B, according to one embodiment of the present invention. The identified dimensions are used to dynamically create the wafer test map pattern in FIG. 3C. All possible test sites that reside inside the specified wafer boundary are specified in the test plan of FIG. 3A.

Moreover, a seed bank data store contains one or more selectable geometric and/or trigonometric definitions based on one or more shape templates. For example, FIG. 4 illustrates dimensions discovered from the wafer test plan used in FIG. 3A, while testing is occurring on the wafer test pattern of FIG. 4. This is done by using shape templates having formal mathematical representations for defined shapes to identify new wafer test map patterns. Shape templates can be automatically identified with unique file names or record identifiers. In one example, a specific shape template dimensions are in a file identified by the name "T95_52_A.wtp." The 'A' in file T95_52_A indicates that this file defines all test sites for a given wafer test map pattern associated with test plan of FIG. 3A. Any additional desired wafer test map patterns can be identified with another template, and the additional template includes a formal representation used to determine the sites for the additionally created wafer test map pattern.

FIG. 4 illustrates a pictorial diagram 400 of a geometric pattern identified from test sites of FIG. 3A, according to one embodiment of the present invention. FIG. 4 is presented for purposes of illustration only. The geometric pattern of diagram 400 corresponds to the newly created map of FIG. 3C. The geometric pattern is derived by overlaying a shape template on the test sites of FIG. 3A. The example shape template dimensions can be formally defined within the file T95_52_A as:

[setup]

| | | |
|---|---|---|
| fileName | = T95_52_A.wtp | |
| version | = 12 | |
| DesignID | = T95 | |
| [mapSetup] | | |
| origin | = TR | // Top Right |
| units | = M | // Metric |
| waferDiameter | = 200 | // 200 mm = 8" |
| DieSize | = 7604, 7127 | // Die Size in Microns |
| NoCols | = 25 | |
| NoRows | = 27 | |
| ReticleFrameSize | = 3, 2 | // Reticle Frame size in die |
| ReticleShift | = −4, −3 | // Reticle Shift |
| flat | = L | // Notch position |
| SetupDie | = 15, 2 | |
| ReferenceDie | = 10, 2 | |

Coordinates $x_0$, $y_0$ define the center of the wafer and d is the wafer diameter. Since dies are different sizes from part to part, the photolithography determines the maximum number of die per wafer. An engineer cannot depend on there being an intersection at the center of the wafer and cannot depend on a reticle field being in the center of the wafer. Therefore, the x reticleshift and y reticleshift compensates for various part-type layouts. The reticle offset will not shift once the part starts production in the wafer testing environment.

$$x_0 = \frac{d}{2} - x \text{ reticle shift}$$

$$y_0 = \frac{d}{2} - y \text{ reticle shift}$$

Let Map, M, be a set of test sites in the total test plan population as illustrated by FIG. 4, Area, A, is the set of all sites included in the donut area, and EM is the excluded set of sites that are not elements of any of the sites in the included set A.

$$M:\text{set}=\{S_1, S_2, \ldots, S_m\}$$

$$A:\text{set}=\{S_{i1}, S_{i2}, \ldots, S_{ia}\}$$

$$EM:\text{set}=\{\, \{S_{e1} \not\in A, S_{e2} \not\in A, \ldots, S_{em} \not\in A\} \subset M\}$$

Radius $R_i: \mathbb{R}$ is the distance between the center of the wafer and a test site in the test plan 400A and this radius can identify one or more sites in set A:

$$R_i = \sqrt{(x_0-x_i)^2+(y_0-y_i)^2}$$

Radius $R_e$:ℝ is the distance between the center of the wafer and the outer edge of the exclusion area 400B and where this radius identifies each site in the excluded set EM:

$$R_e = (\text{percent}) \frac{WaferDiameter}{2}$$

For quantification 400C, there exists a site, $S\langle x_i, y_i \rangle$, such that $S\langle x_i, y_i \rangle$ is an element of set, A, that intersects set M, qualified by predicate, included. The predicate, included, evaluates to true if the wafer radius lower bound, R is greater than the radius being tested, $R_i$, and, $R_i$, is greater than the excluded radius upper bound, $R_e$.

$$\exists S\langle x_i, y_i \rangle \cap |(S\langle x_i, y_i \rangle \in A \cap S\langle x_i, y_i \rangle \in M):\text{included} \\ (R > R_i > R_e)$$

Therefore, set area, A, is the difference between set M and set EM:

$$\therefore A:\text{set} = M:\text{set} - EM:\text{set}$$

At run-time, if a threshold is exceeded on a register (e.g., upper control limit), iterating over all sites in set, M, the subset of sites that are included in the requested donut area, set A can be found:

$$A:\text{set} \subseteq \{\forall S\langle x_i, y_i \rangle \subset M | (R > R_i > R_e) \to S \in A\}$$

FIGS. 5A–5D illustrate pictorial diagrams for different shape templates and their dimensions and conditions derived from and processed on the test sites of FIG. 3A in order to dynamically create the wafer test map similar to the one of FIG. 3C, according to one embodiment of the present invention.

Figure 5A:
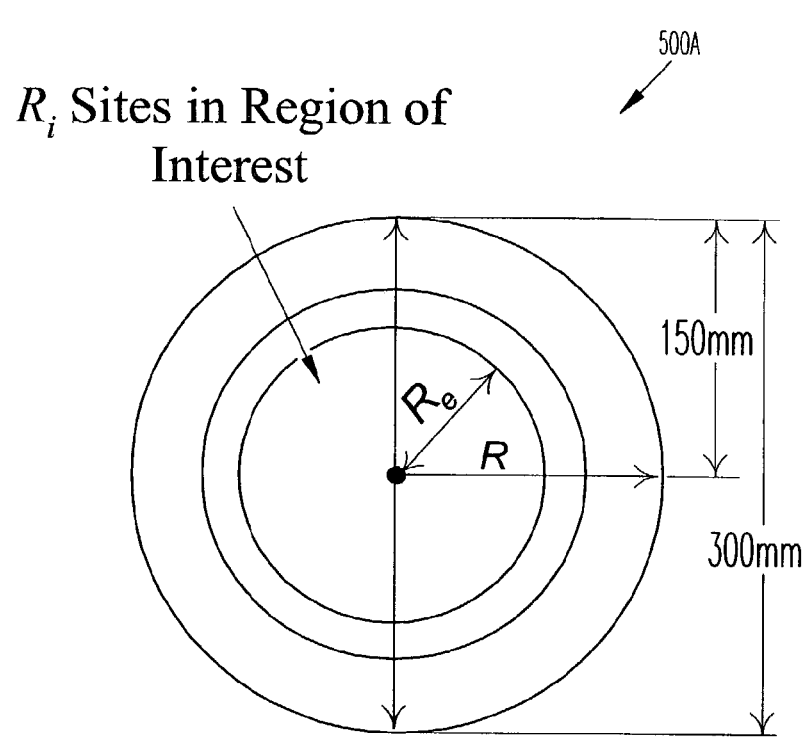
FIGS. 5A–5D depict pictorial diagrams of differently shaped templates and their dimensions and conditions derived from and processing performed on test sites of FIG. 3A in order to dynamically create the wafer test map similar to the one depicted in FIG. 3C and associated with various geometrical patterns of interest, according to one embodiment of the present invention.

FIG. 5A illustrates reversing donut sites in a region of interest for creating the wafer test map pattern similar to the one of FIG. 3C and can be formally represented as:

$$\exists S\langle x_i, y_i \rangle (S\langle x_i, y_i \rangle \in A \cap S\langle x_i, y_i \rangle \in M):\text{included } (R_{i>Re})$$

Figure 5B:
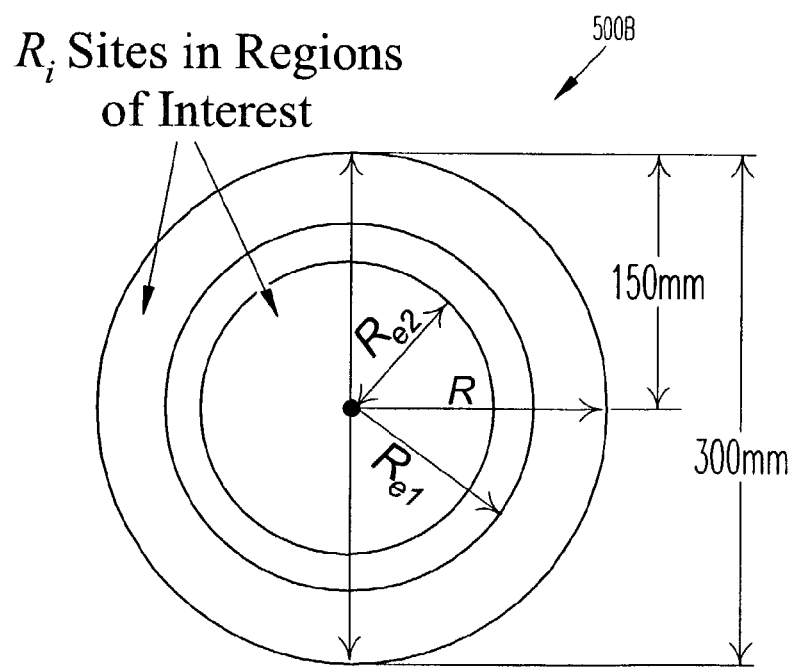

FIG. 5B illustrates nesting donut sites in regions of interest for hatching the wafer test map pattern of FIG. 3C, and can be formally represented as:

$$\exists S\langle x_i, y_i \rangle (S\langle x_i, y_i \rangle \in A \cap S\langle x_i, y_i \rangle \in M):\text{included} \\ ((R_{ei} > R_i > R) \lor (R_i > R_{e2}))$$

Figure 5C:
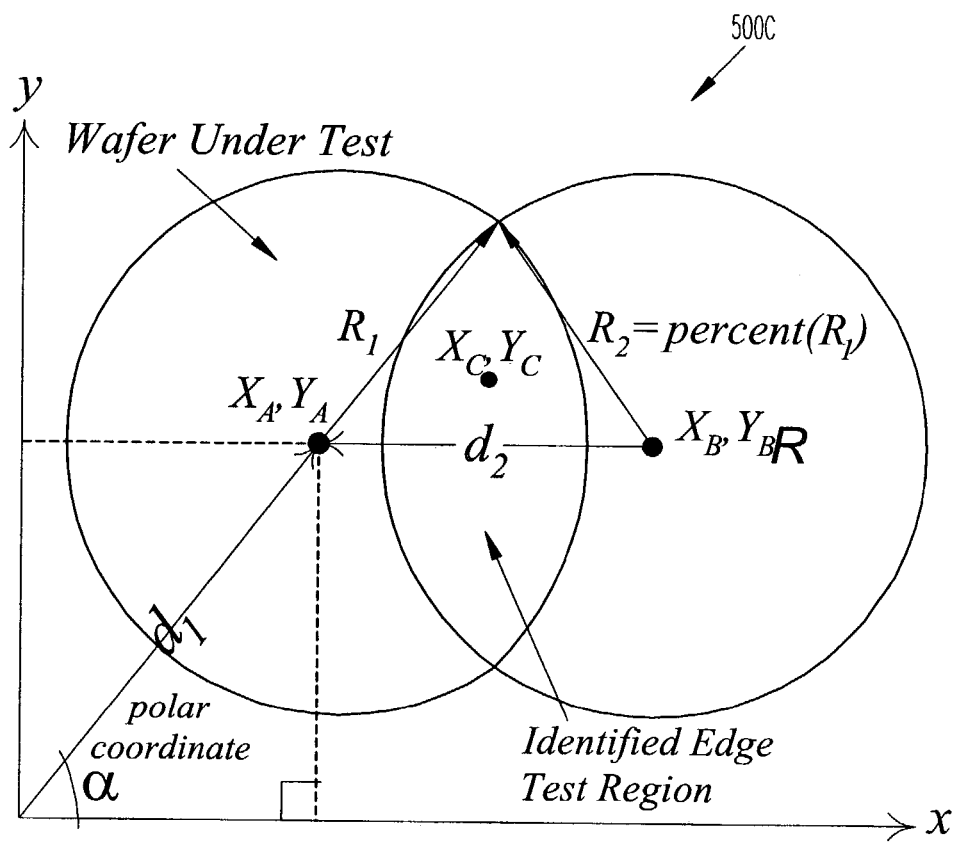
Figure 5D:
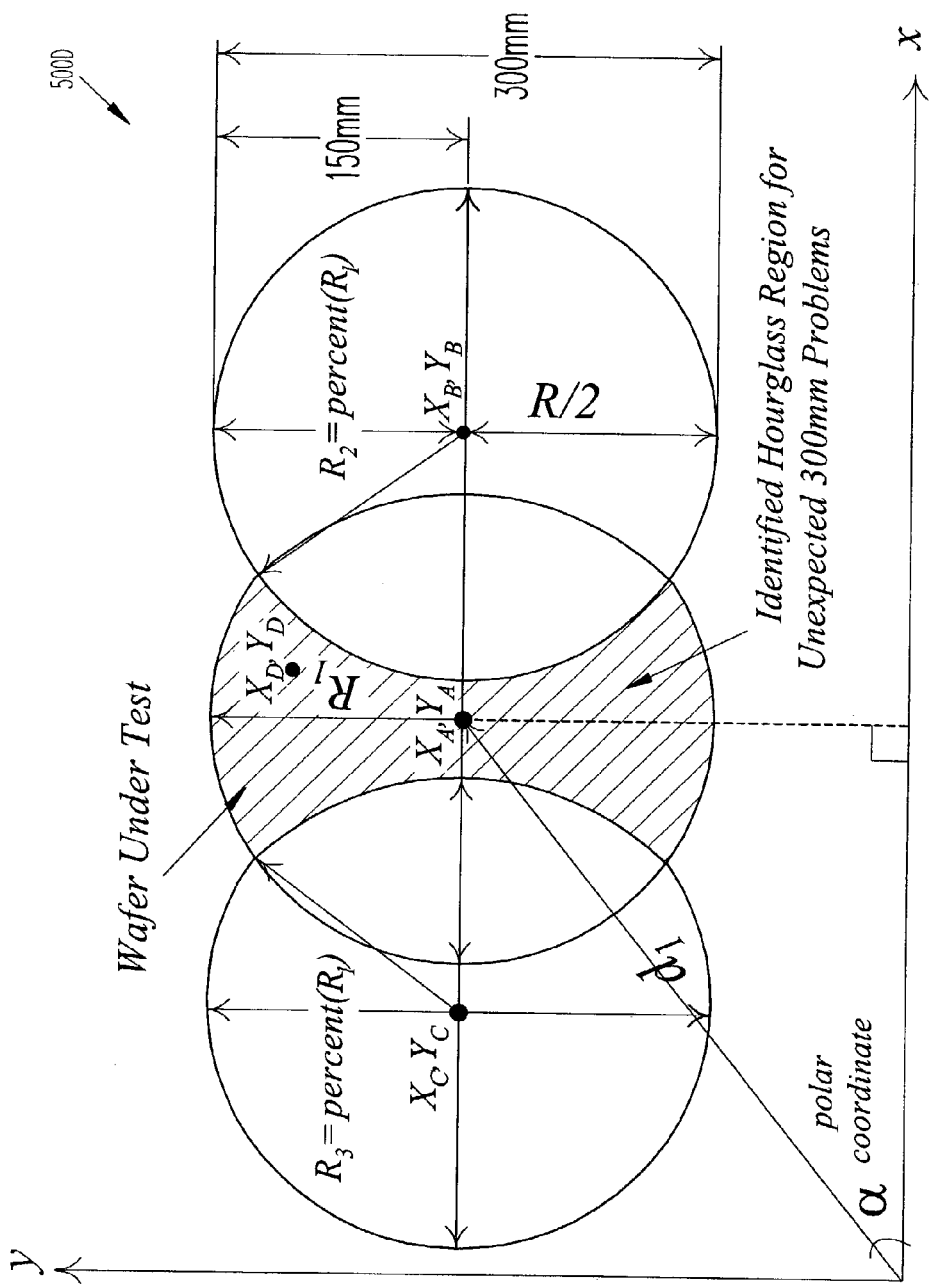

FIG. 5C illustrates finding edge sites to test an overetched region. A test plan specifies constants, $R_2$ and $d_2$. Where $R_2$ is the percentage of the radius associated with the Right Round Shape. And, where $d_2$ is the distance between two overlapping round shapes.

$$R_2 = (\text{percent}) \frac{WaferDiameter}{2}$$

$d_2 \leq$ WaferDiameter $d_1 >$ WaferRadius

Alternatively, the coordinates such as $X_A$, $Y_A$ may be transformed into polar coordinates calculated from angle α.

$$Y_A = d_1 \cdot \sin\alpha$$

$$X_A = d_1 \cdot \cos\alpha$$

Let M be a set of test sites in the total population, area, A, is the included set of all sites included in the moon-like pattern, and EM is the excluded set of sites that are not elements of any of the sites in set A and subset of set M.

$$M:\text{set} = \{S_1, S_2, \ldots, S_m\}$$

$$A:\text{set} = \{S_1, S_2, \ldots, S_a\}$$

$$EM:\text{set} = \{\{S_{e1}@A, S_{e2}@AREA, \ldots, S_{em}@A\} \subset M\}$$

Let |CB| be the distance between two points on the Right Round shape:

$$|CB| = \sqrt{(X_C - X_B)^2 + (Y_C - Y_B)^2}$$

Let |CA| be the distance between two points on the Left Round shape:

$$|CA| = 29\sqrt{(X_C - X_A)^2 + (Y_C Y_A)^2}$$

|CA|distance$_\land$|CB| distance identifies one or more sites in the set area, A, (e.g., Edge Test Region) only if |CA| < $R_{1\land}$|CB| < $R_2$ evaluate to true. There exists a site, $S\langle x_c, y_c \rangle$ such that this site is an element of the set area, A, that is a subset of the set M only if the predicate, included evaluates to true:

$$\exists S\langle x_c, y_c \rangle (S \in A \cap S \in M):\text{included}((|CA| < R_1) \land (|CB| < R_2))$$

At run-time iterating over all sites in the set M we find the A subset:

$$A:\text{set}: \{\forall S\langle x_i, y_i \rangle \subset M | \text{included}((|CA| < R_1) \land (|CB| < R_2) \to \\ S\langle x_i, y_i \rangle \in A\}$$

Building on previous examples, FIGS. 5A–5C and FIG. 5D show how the test plan can specify two half moon shapes resulting in finding sites located in the outer edges of the wafer under test. Thus, FIG. 5D may show a search processing at run-time for an unknown 300 mm problem that needs an hourglass test pattern or symmetrical edge test pattern.

Figure 6A:
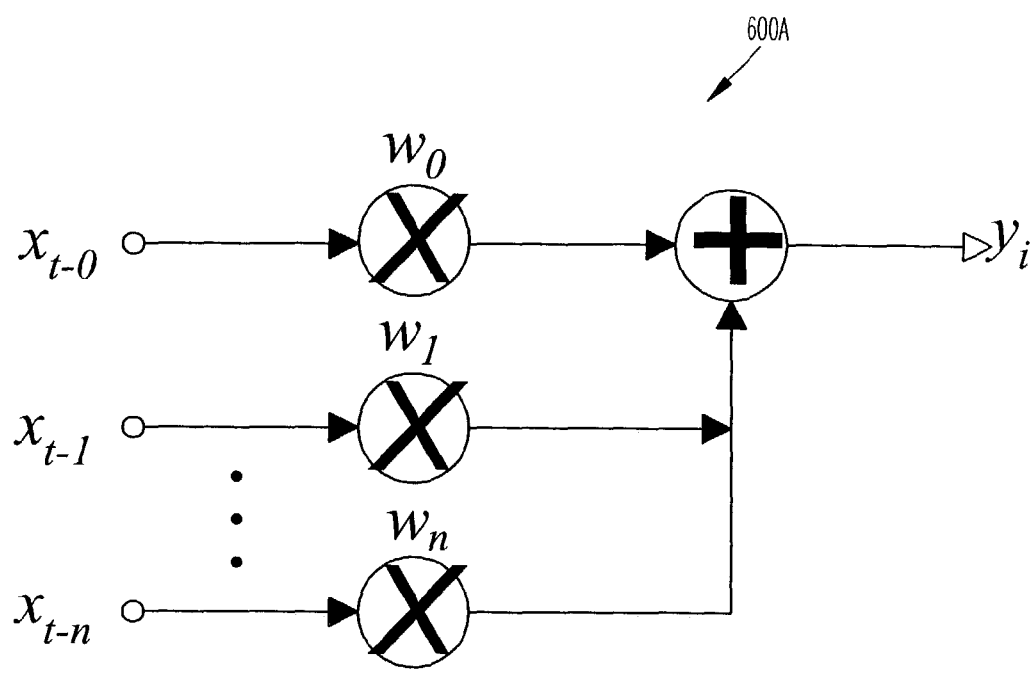
FIGS. 6A–6F depict various diagrams for example filters and hardware architecture configurations controlling triggering the creation of new maps, according to various embodiments of the present invention.

FIG. 6A illustrates a pictorial diagram 600A of one example Finite Impulse Filter (FIR) used to suppress the unnecessary triggering creation of new wafer test maps during a lot testing session, according to one embodiment of the present invention.

To induce wafer map creation during a lot testing session, there are N dedicated In Situ Statistics Sensors (ISSS)-by-M dedicated In Situ Statistics Processors (ISSP). Each ISSS is driven by a measurement acquired from the integrated measurement system 107 and a register uniquely identifies each kind of measurement.

Figures 1, 6B:
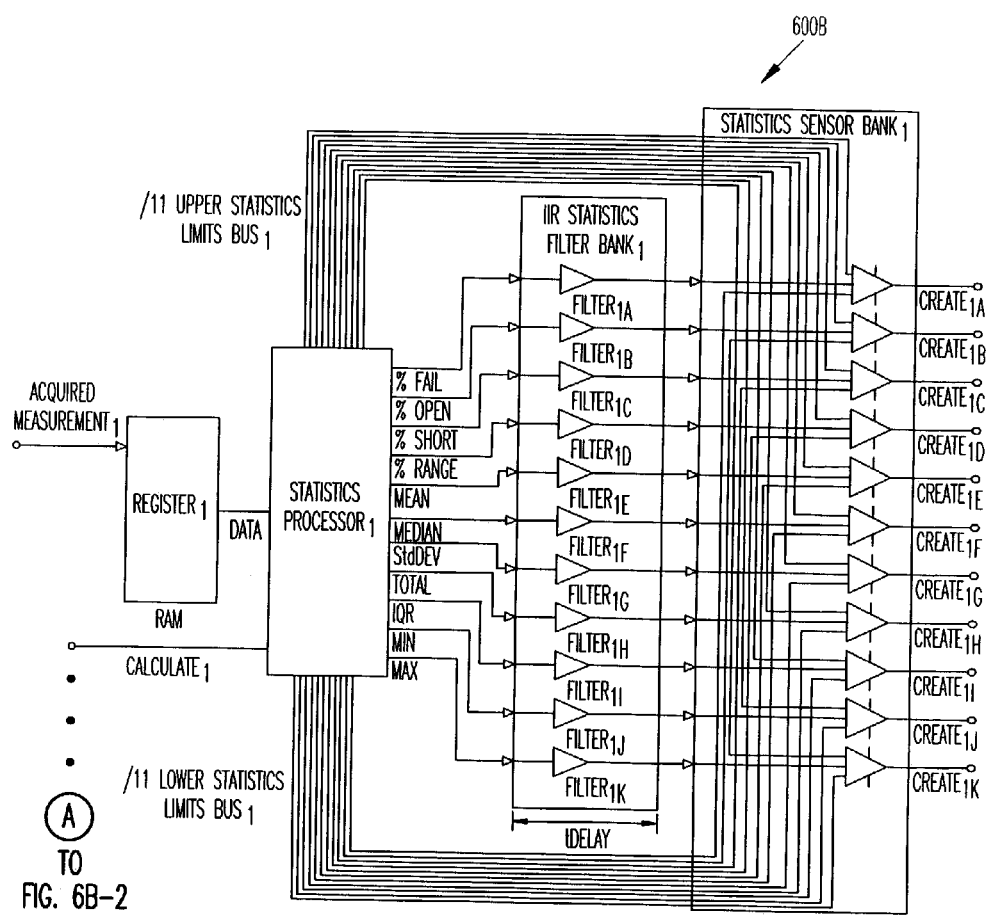
Figures 2, 6B:
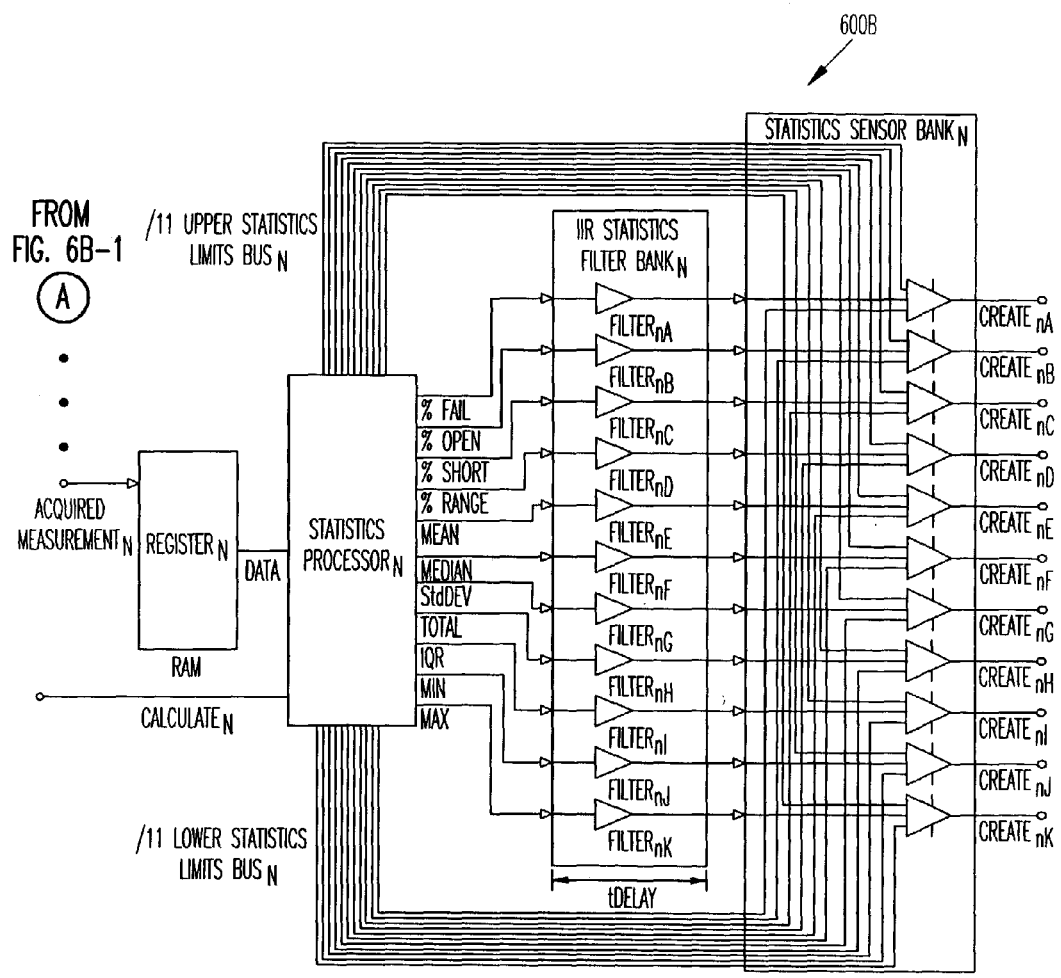

After each measurement acquisition, the measured result is rendered on or by graphical user interface (GUI). Concurrently, while the measurement is being rendered, the dedicated ISSP processor associated with that kind of measurement calculates the statistics. Each ISSS sensor can sense more than one type of statistic, such as: mean, standard deviation, sum, median, IQR, minimum, maximum, percent fail, percent short, and percent range. FIG. 6B illustrates an example machine architecture 600B for a processor, including a filter bank and a sensor bank for each test register. Each ISSS sensor's resulting statistic is latched and then evaluated against an upper control or lower control limit specified by the type of statistic. If a limit is exceeded, then the ISSS sensor notifies the multithreaded parametric inline engine control. In response to the notification (event stimulus), the seed associated with the register is used to create shape boundary over the intersecting sites, as illustrated by FIG. 4 and FIGS. 5A–5D. This area subset instantiates the wafer test map that is invoked and it is this wafer test map that can govern the movement progression of the prober subsystem on the next pass.

Suppressing a wafer test map creation can yield more test time for the hundreds (or thousands) of other sensors, which can also reach their control limits. Therefore it is desirable to avoid noisy ISSS triggering of the parametric inline engine control to create a new wafer test map. In a worstcase scenario, wafer test maps may continuously be created until all test sites have been tested.

Thus, to prevent noisy triggering, a suppression filter can be applied to statistic data ISSS. In some embodiments, there are two candidate filters: FIR depicted in FIG. 6A and Infinite Impulse Response (IIR) filters. FIRs are good candidates for band filters. FIR examples include Chebyshev, Butterworth, and Battler filters.

Given statistics input, $x_j$, the discrete FIR function response (FIG. 6A) produces output, $y_i$:

$$y_i = \sum_{j=0}^{n} w_j \times x_{t-j}$$

Where n is the number of statistic data samples back in time posted by the ISSP, and $w_j$ are weighting factors of the filter that determine its type and characteristics. Notice the following precondition exits for the discrete FIR.

$$\sum_{j=0}^{n} w_j = 1$$

Figure 6C:
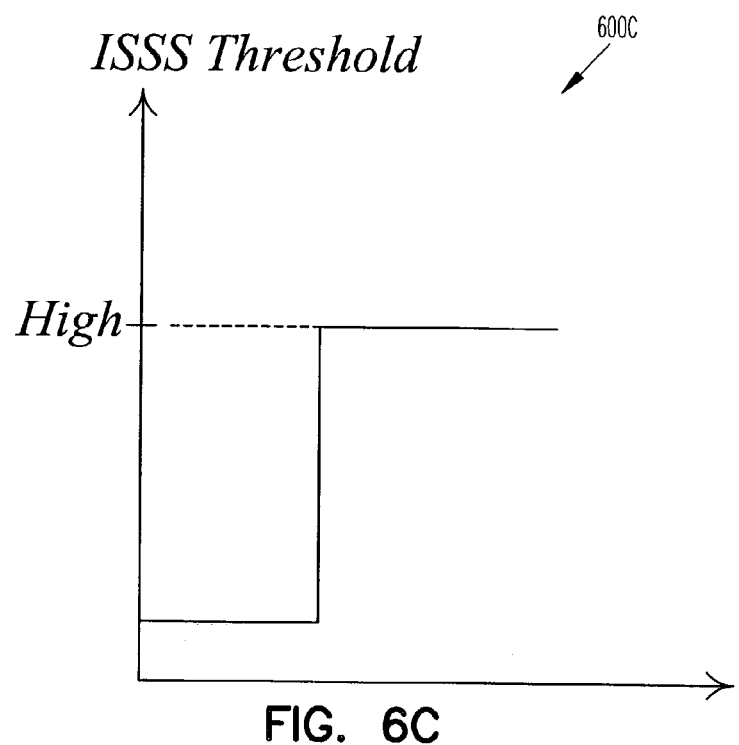
Figure 6D:
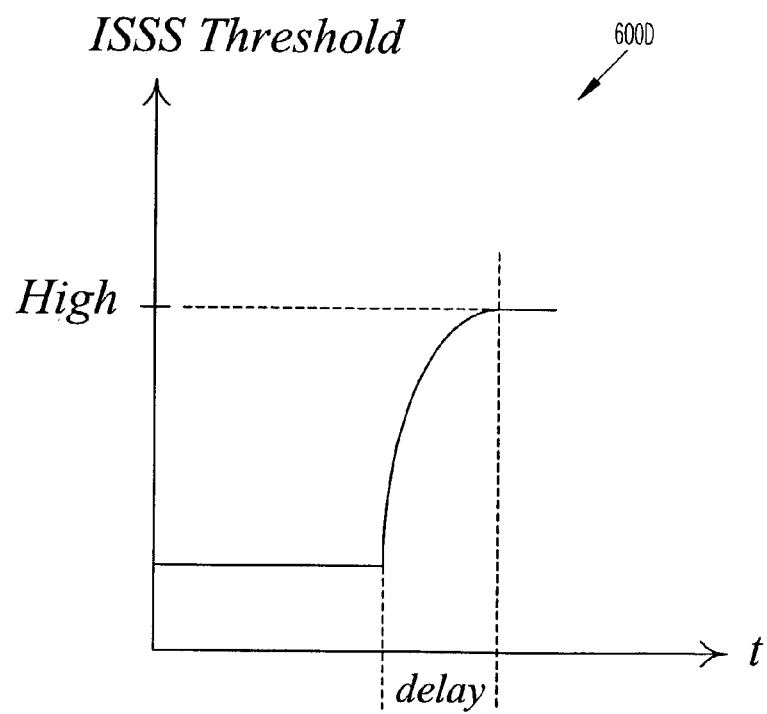

FIGS. 6C and 6D show example possible input signal shapes and FIR Filter responses.

Figure 6E:
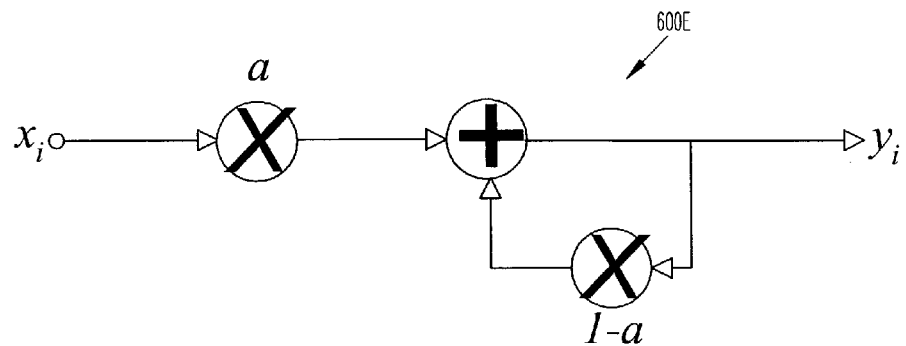

In contrast, IIRs can be good candidates for unknown noisy signals. For the initial, testing environments, prototypes, and in some embodiments, an engineer can select dedicated IIR filtering on each ISSS. FIG. 6E illustrates a block diagram 600E describing the essential input/output relationship of an IIR filter, which can be applied to each ISSS. For example, an Exponentially Weighted Moving Average (EWMA) filter can be the fastest one.

Thus, given statistics input, $x_j$, the IIR function response produces output, $y_i$:

$$y_i = ax_i + (1-a)y_{i-1}$$

Figure 6F:
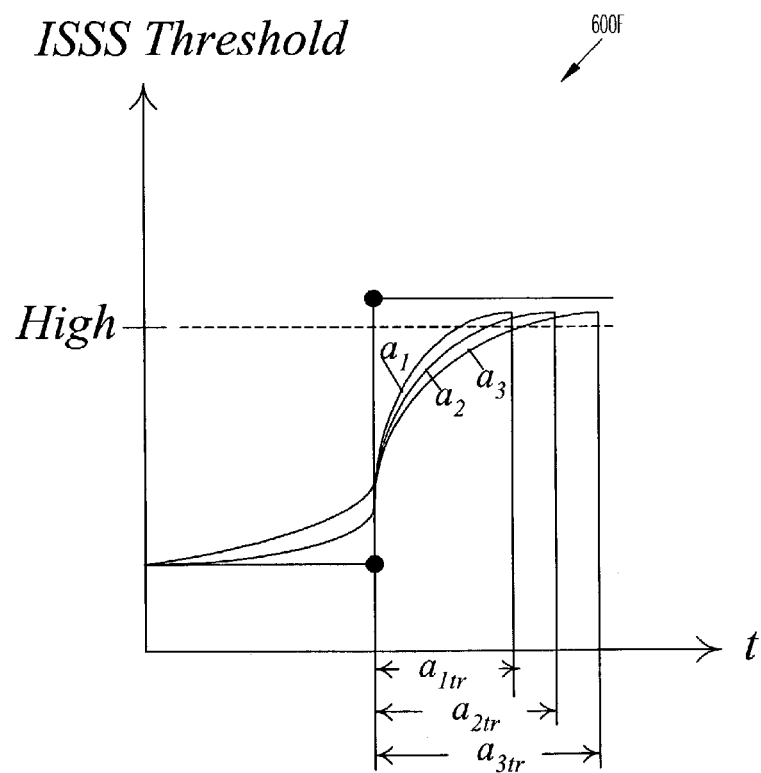

In implementation, the IIR Filter class can store the constant a (e.g., 0.5). The expression, $y_{i-1}$, is a previous filter output. The previous filter output persists in the class instance. Therefore, $x_i$ is the input statistic and $y_i$ is the filtered output statistic. The IIR response is shown below in FIG. 6F.

The initial first sample may use condition that $y_{i-1=xi}$ as no previous output is known at the first sample. Notice in FIG. 6F that $a_1$, $a_2$, and $a_3$ denote settling time to 95 percent of impulse input signal with a logical high reduced to 95 percent.

$$a_1 > a_2 > a_3$$

If a=1, then there is no filtering:

$$a=1 \rightarrow UNITY$$

With various kinds of measurements (e.g., 32,000 types of measurements per test), there is a dedicated ISSP, IIR Filter Bank, and ISSS for each register (FIG. 6B). The sensor would trigger the creation of a new wafer test map.

The various embodiments of configurations and filters depicted in FIGS. 6A–6F can be implemented in hardware, software, and/or a combination of software and hardware. In a hardware implementation, in some embodiments, Reprogrammable Field Programmable Gate Arrays (FPGAs) is used so that the machine architecture 600B of FIG. 6B is achieved.

Notice in FIG. 6B, each acquired measurement is buffered in Random Access Memory (RAM) and processed by its own dedicated processor, filter, and sensor. Each sensor compares the data statistic to the upper statistic limit and lower statistic limit. This can be done using a window comparator circuitry. If either limit is exceeded, then corresponding output of the sensor may be latched.

In various embodiments of the present invention, the following keywords specify what kind of statistics can be performed on a register depicted in example machine architecture in FIG. 6B. These keywords follow the register specification in a test plan and represent the statistics that are performed on each particular register.

| Kind of Statistic | Semantics |
| --- | --- |
| Fail | Specifies that a percentage of all failures to be performed. A state of failure is determined by the fact that the register value is greater than or equal to Upper Acceptable Value (UAV) or lower than or equal to Lower Acceptable Value (LAV) or equal to 998.0. A hold condition will be flagged if the percentage of failures is less than or equal to Lower Hold Limit (LHL) or greater than or equal to Upper Hold Limit (UHL). For example: fail = .01, 10, , 5 |
| Open | Specifies that a percentage of all-opens to be performed. A state of open is determined by the fact that the register value is greater than or equal to UAV. A hold condition will be flagged if the percentage of opens is less than or equal to LHL or greater than or equal to UHL. For example: open = , 100.0, 10, 80 |
| Short | Specifies that a percentage of all shorts to be performed. A state of short is determined by the fact that the register value is less than or equal to LAV. A hold condition will be flagged if the percentage of opens is less than or equal to LHL or greater than or equal to UHL. For example: short = 100.0, , 10, 80 |
| Range | Specifies that a percentage of all values in the specified range to be performed. A state of falling in the specified range is determined by the fact that the register value is between LAV and UAV. A hold condition will be flagged if the final calculation is outside of the LHL and UHL or equal to them. For example: range = , 3.6, 4.6. |

-continued

| Kind of Statistic | Semantics |
| --- | --- |
| Mean | Specifies that a mean calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: mean = , 3.6, 4.6, 1223 |
| Median | Specifies that a median calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: median = , 200.0, 100.0, 1000, 435 |
| StandardDeviation | Specifies that a standard deviation calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: stddev = , 125.8, , 20.0 |
| Total | Specifies that a total calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: total = , , , , |
| IQR | Specifies that a Inter Quartile Range (IQR) calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: iqr = , , 100, 200 |
| Min | Specifies that a minimum calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: min = , 100, , 50 |
| Max | Specifies that a maximum calculation will be done on the data. The calculation excludes all values of 998.0, 999.0, and −999.0. The data is included in the calculation if it is between LAV and UAV. A hold condition will be flagged if the final calculation is outside of the LHL and UHL limits or equal to them. For example: max = 100, , , 200 |

Additionally, in some embodiments, the following keywords are the parameters used to define each kind of statistics for a register:

| Statistical Parameters Per Register | Semantics |
| --- | --- |
| LAV | Lower Acceptable Value. Determines the lower range for a register value to be included into statistic calculations. Default value = −1.0e30. |
| UAV | Upper Acceptable Value. Determines the upper range for a register value to be included into statistic calculations. Default value is +1.0e30. |
| LHL | Lower Hold Limit. Determines the smallest acceptable statistic value (or percentage for fail, open, short, range) that can be encountered without flagging a hold condition. Hold condition will be flagged if statistic is less than the limit. Default value is −1.0e30. |
| UHL | Upper Hold Limit. Determines the greatest acceptable statistic value (or percentage for fail, open, short, range) that can be encountered without flagging a hold condition. Hold condition will be flagged if statistic is greater than the limit. Default value is +1.0e30. |
| LT | Lot Tracking register number specifies if the lot tracking is supported. The executive will generate the track files (*.TRK) and include statistics with specified LT number. This file will later be sent to the lot-tracking database. Lot tracking is available for all statistics. Lot tracking register number is optional. |
| IIR FILTER COEFFICIENT | To drive the Infinite Impulse Response EWMA Filter, $y_i = ax_i + (1 - a)y_{i-1}$, the coefficient, a, needs to be specified. Where a, is a real number greater than zero and less than or equal to one: $0 < a \leq 1$. If the coefficient is set to one, then no filter is applied to the statistical result. Default is 1.0, which means that no filter is applied. |

-continued

| Statistical Parameters Per Register | Semantics |
|---|---|
| SEED | Defines an enumeration of recognized geometric pattern nicknames to be used in the creation of the resultant wafer map, which pertain to the semiconductor test paradigm. This is the pattern that will be used if a wafer map should be created upon the exceeding the Lower Hold Limit or Upper Hold Limit. The overlaid geometric pattern placed onto the wafer under test is defined by the Pattern enumerations: Pattern {Center-Only, Donut, Edge-Only, Edge-To-Center, Half-Moon, Notch-Only, Single-Site, Notch-To-Center}. |
| SITE SELECTION | Defines how sites that intersect the overlaid Pattern are included in the final wafer map creation. Sites that intersect the overlaid geometric pattern can be selected either by (1) using a checkerboard pattern of available sites, or (2) using percentage of total sites randomly selected. The selection criteria of intersecting sites is defined by keywords Checkerboard or Percentage. |

In still more embodiments, the following example defines Register 100 with a=0.3 IIR Filter coefficient with the potential to trigger the creation of an Edge-Only wafer map with 20 percent random selection attached to the register mean statistic.

register=100, Cell Poly 10 sq Res, C, ohms/sq, , 0, 1000
mean=−1.0e30, +1.0e30, 200, 400, 3085, 0.3, Edge-Only, 20

Creation of the new map for the specific register statistic may be done once per wafer run as a stop criteria.

FIGS. 7A–7I illustrate example software data structures and interactions that can be used with embodiments of the present invention. Thus, in addition to or in conjunction with the example machine architecture 600B, presented in FIG. 6B, a group of software data structures 700A–700H interact to logically implement various embodiments of the present invention, where wafer test maps are dynamically created during a testing session.

Figures 1, 7A:
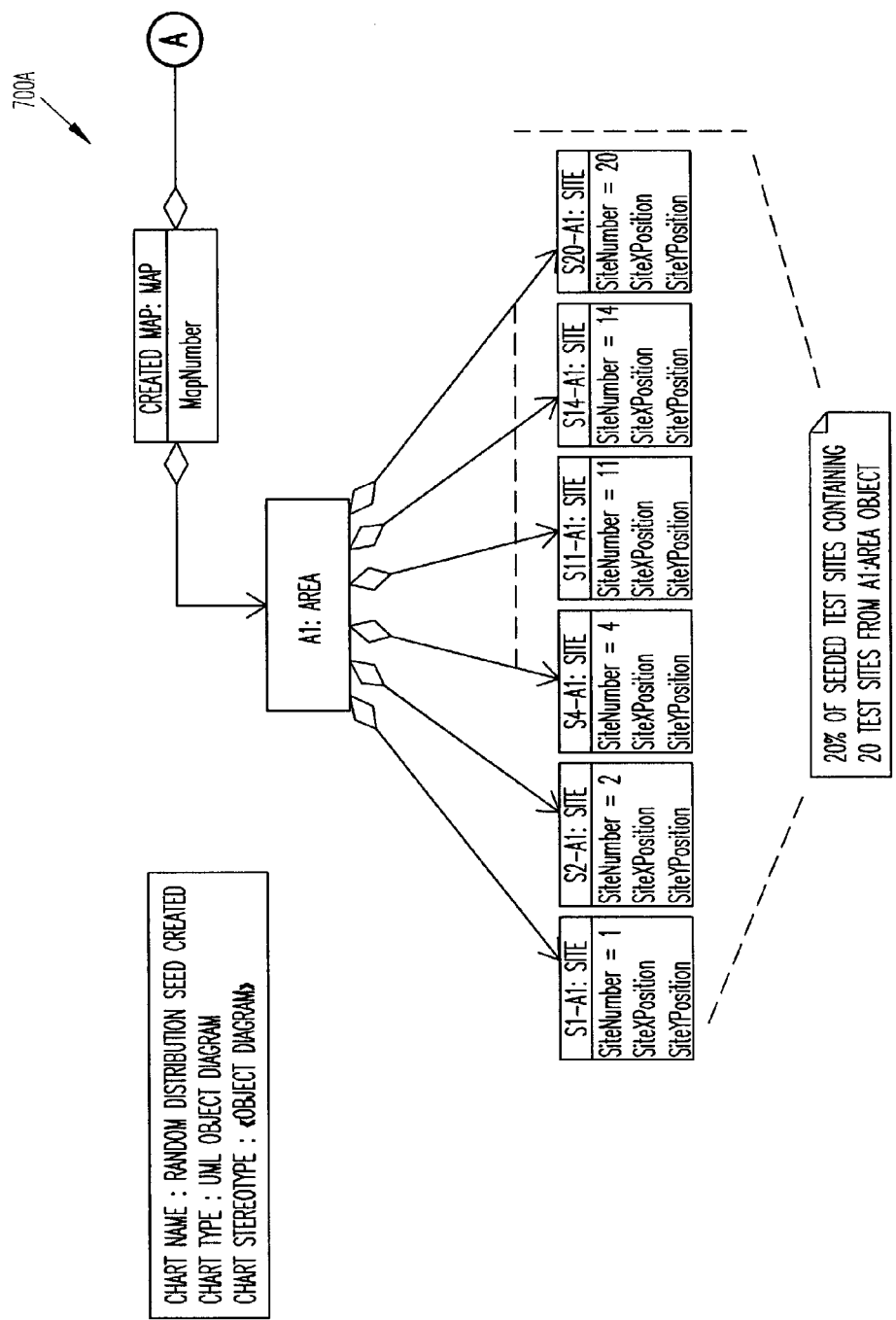
FIGS. 7A–7I depict various class and object diagrams and state charts for processing and software architecture configurations involved in new map creation, according to various embodiments of the present invention.
Figures 2, 7A:
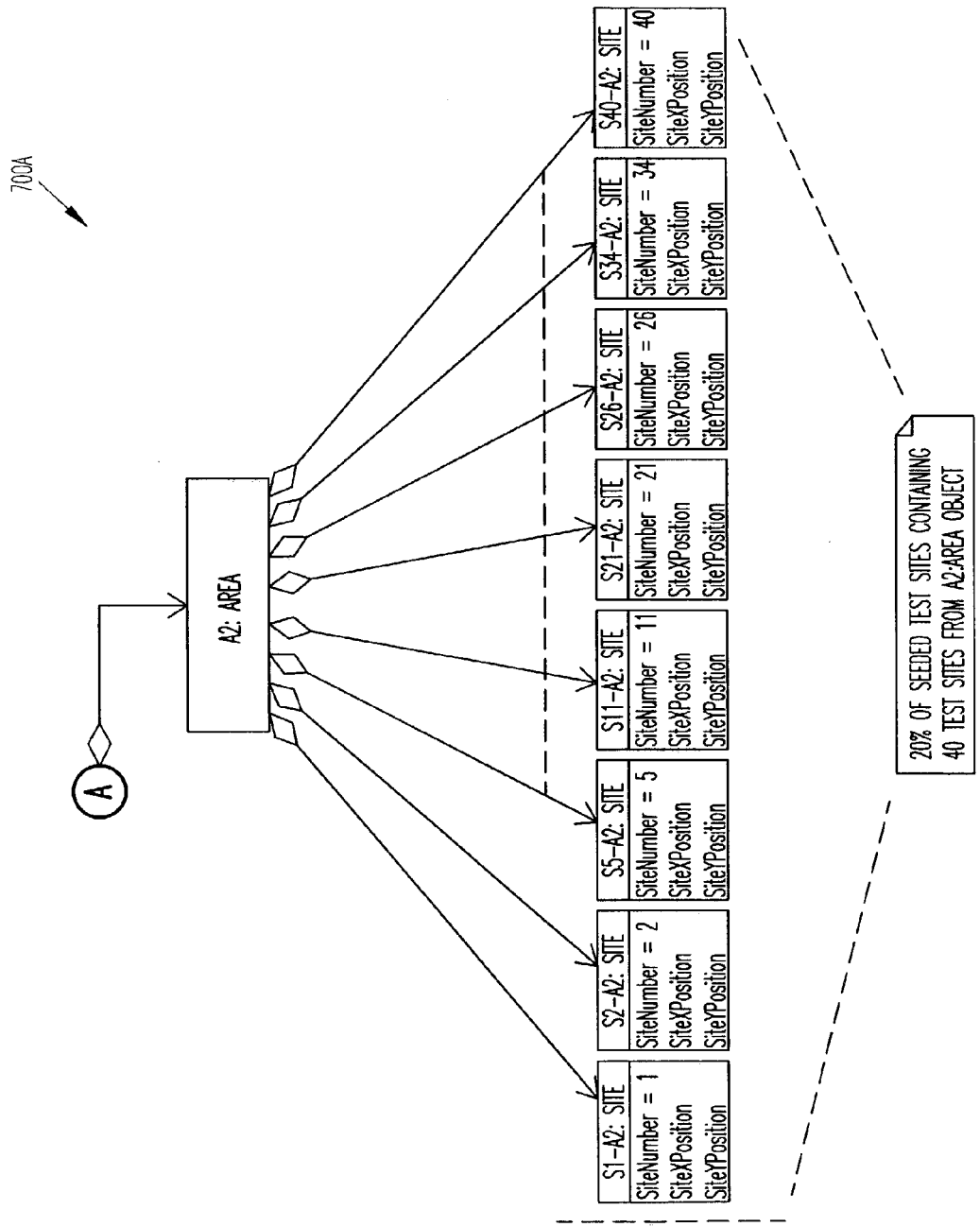
Figure 7B:
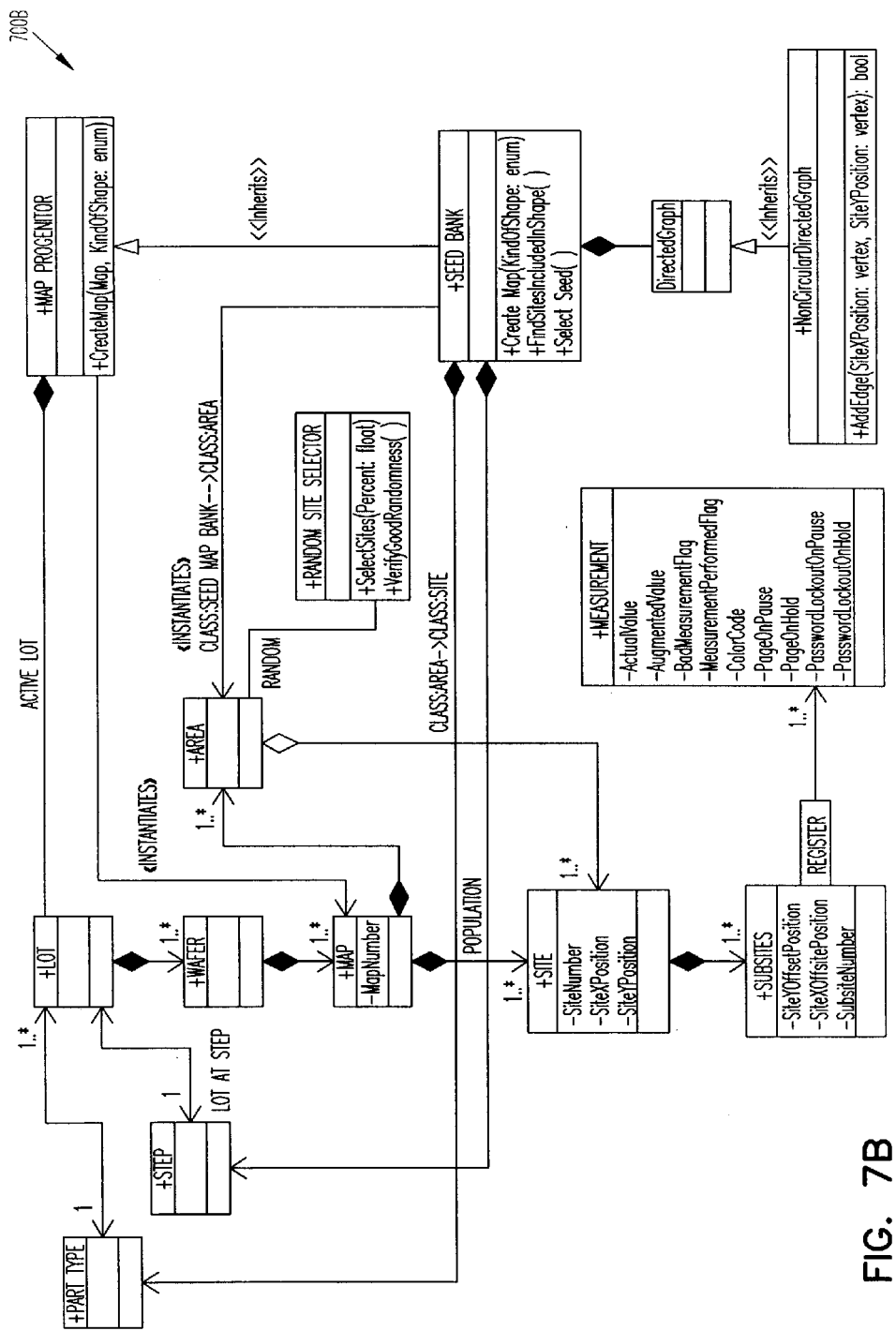
Figure 7C:
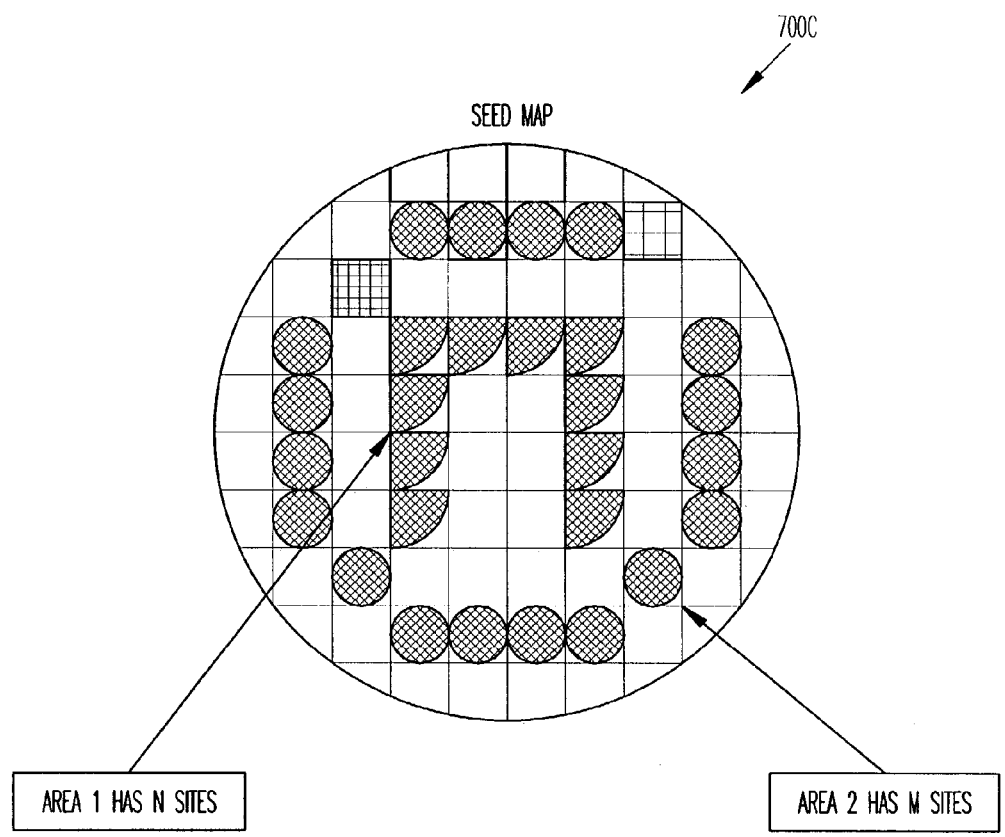

For example, FIG. 7A illustrates the dynamic instantiation of two areas of new map, and FIG. 7B illustrates how the example software objects 700A can be organized in a class diagram 700B to dynamically create wafer test maps during a wafer lot testing session. A limit for the number of Map objects is reached when all testable sites of wafer 300A have been tested. Repeating sites can slow production throughput. FIG. 7C illustrates visually locations of test sites in both areas of the dynamically created wafer test map 700C.

If a site object has already been tested but intersects the area of the seed pattern, then this site is excluded from the newly created map. Each instance of a map contains sites, which have not yet been tested by a previous map. To ensure no test sites are revisited, a NonCircularDirectedGraph object is used (FIG. 7B). Each site is added the NonCircularDirectedGraph.

Moreover, if NonCircularDirectedGraph::AddEdge method returns false, then this means the site has already been added to the graph, and this site is excluded from the map. The test plan formal grammar can permit specifying the maximum number of maps.

If no upper limit is specified, then eventually all test sites may be tested. The test plan grammar is checked to ensure no duplicate test sites exist for a map. Creating a map can occur of at the end of the actively selected map progression or the actively selected map progression can be interrupted.

In some embodiments, Sites that intersect the overlaid geometric shape can be selected either by (1) using a checkerboard pattern of available sites, or (2) using percentage of total sites randomly selected. FIG. 7C shows how one seed map is formed from two areas. Each area has N and M sites respectively.

FIG. 7A, an example object instantiation diagram, illustrates the use of 20 percent of seeded test sites containing 20 test sites from A1: Area object and 20 percent of seeded test sites containing 40 sites from A2: Area object, resulting in 4 chosen sites from A-1: Area and 8 chosen sites from A-2: Area respectively, where the entire testable site population has been predefined in the wafer test plan. For each testable site there exists a physical die coordinate with one or more sub-site coordinates. Finally, each sub-site coordinate is associated with an executable electrical test, which generates one or more measurements.

In one embodiment, the Seed Bank procures a random distribution of sites by delegating to the Random Site Selector Class (FIG. 7B). The frequencies of the site occurrences of all the values should not be exactly the same. To ensure adequate randomness amongst the newly formed subset of sites, a chi-square test can be applied.

Thus, where N is the total number of intersected sites found from using the pattern, i is the index referencing a site coordinate of the AREA:set, and r is a number of sites less than N. If chi-square is close to r, then the sites are randomly selected; if it is too far away, then the sites are not randomly selected.

$$\chi^2 = \frac{\sum 0 \le i < r(f_i - N/r)^2}{N/r}$$

Figure 7D:
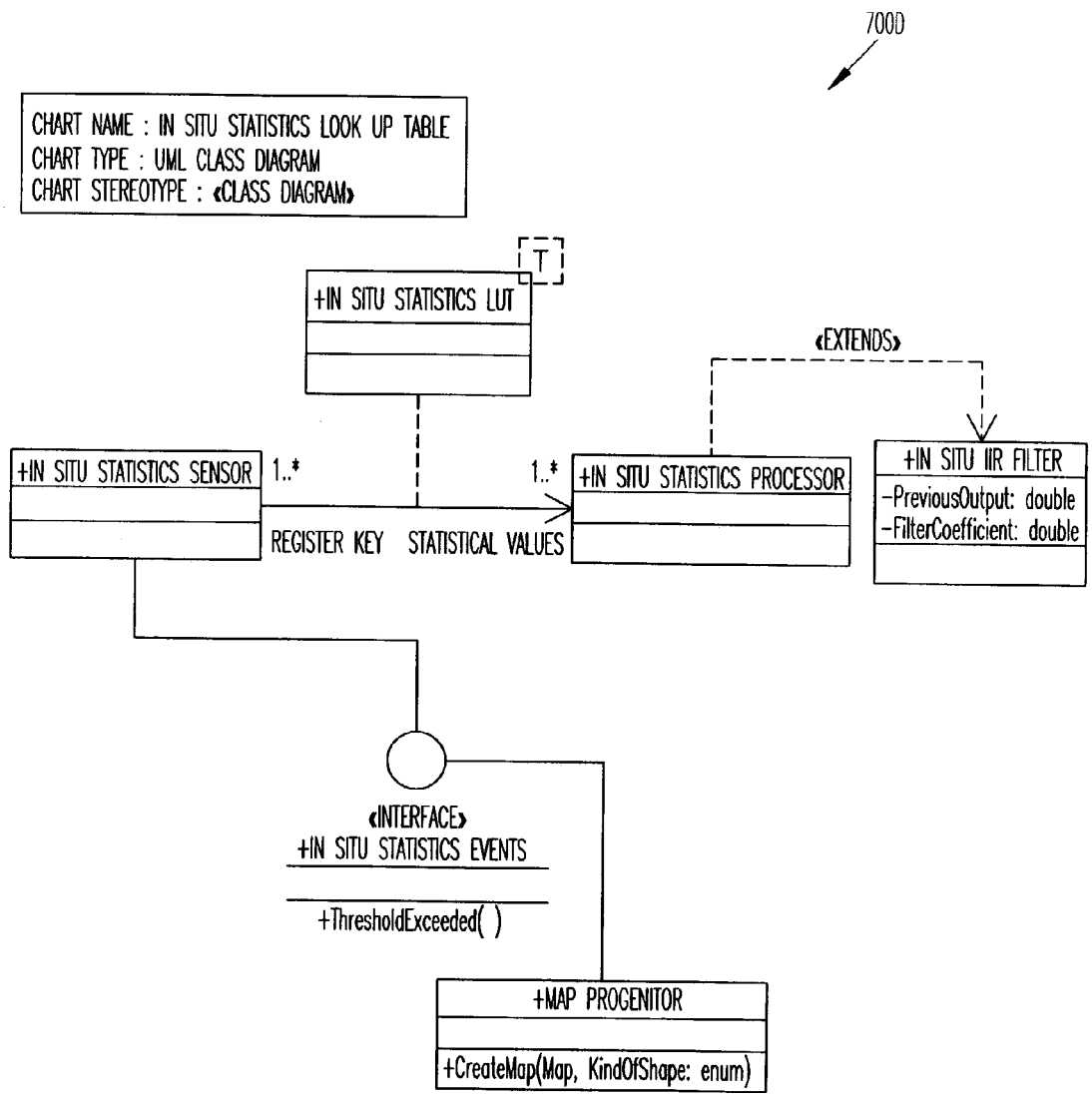

FIG. 7D, an example of the class diagram, illustrates relationship of ISSS, ISSP, and IIR filters with fast statistics Lookup Table (LUT). LUT is used to implement statistical threshold and control rules. Additionally, Map Progenitor is triggered by statistics events from ISSPs to create new maps.

Figure 7E:
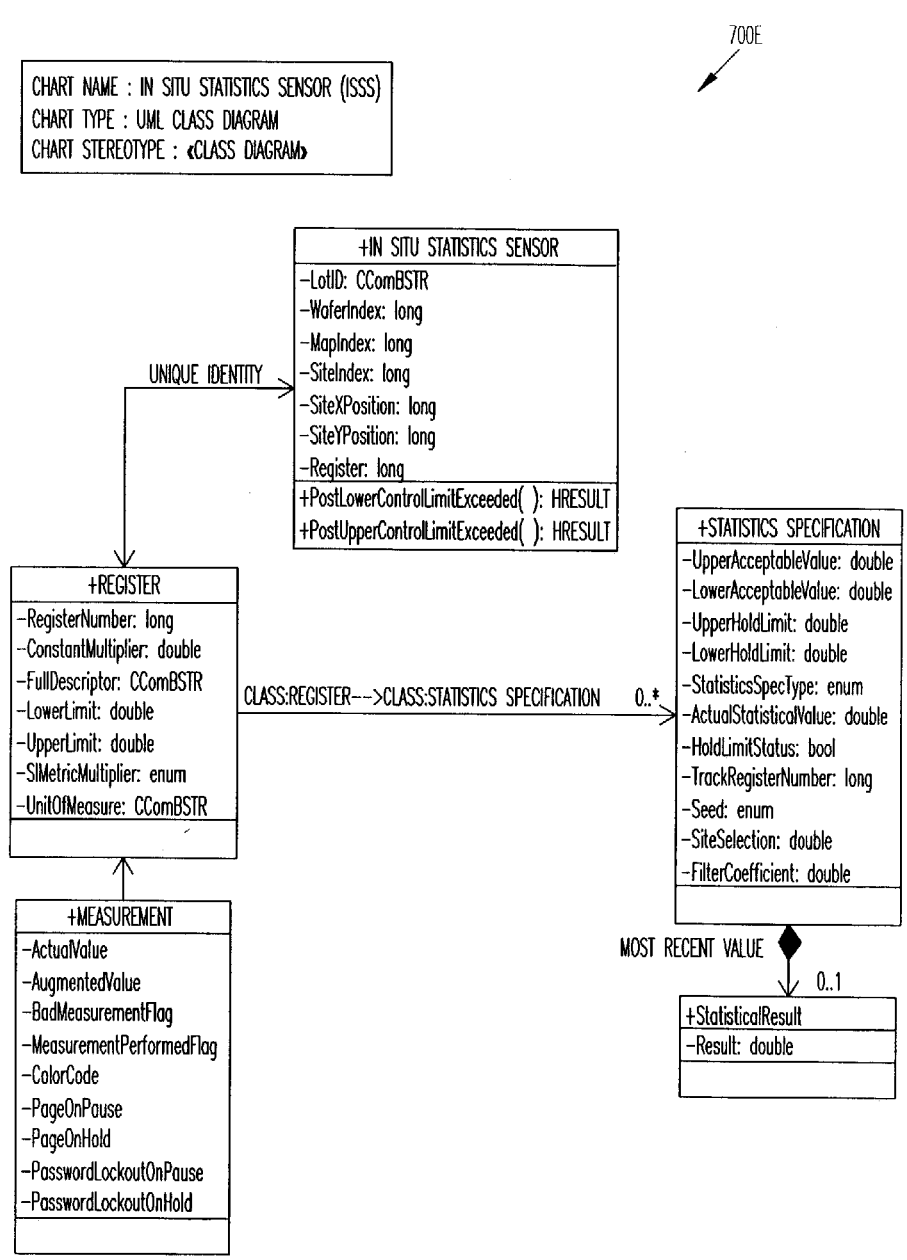

In FIG. 7E, each measurement acquired from the parametric test system is uniquely identified by a register number, which is encapsulated in the ISSS Class diagram 700E. The measured value is added to the ISSS Processor, which maintains a raw sample of previously measured values for that same register. Statistics specifications associated with the register are calculated, and each resultant statistic is evaluated against its upper or lower control limit.

One example embodiment can be explained with the following condition: if a control limit is exceeded, then a ThresholdExceeded event is fired and received by the Map Progenitor object. The Map Progenitor uses this event stimulus to create a new map. To minimize false out-of-control alarms, an Input Impulse Filter can be applied.

Figure 7F:
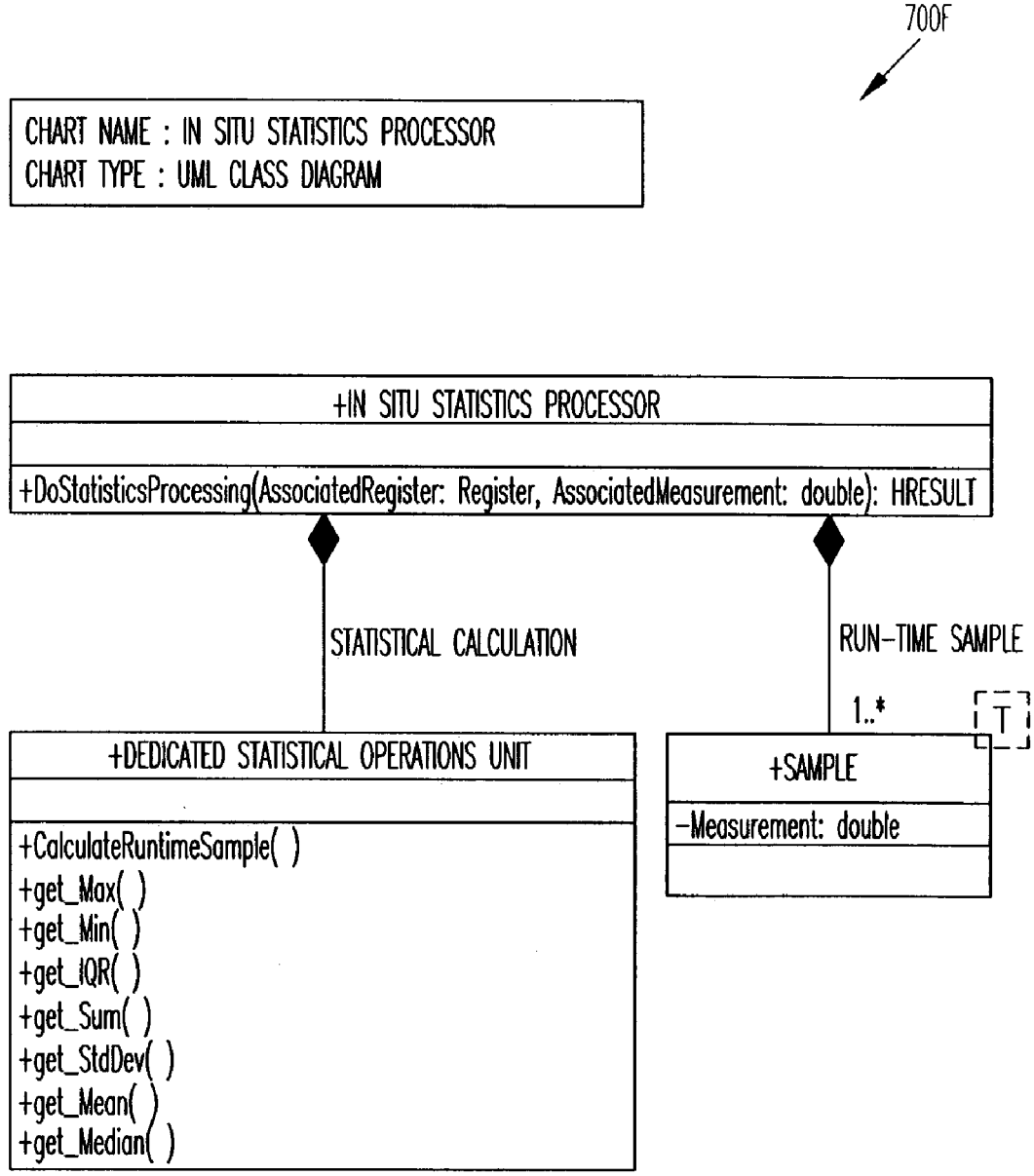

Continuing with the present example, as depicted in FIG. 7E, each Register has zero to many Statistics Specifications. Each Statistics Specification holds onto its most recently calculated value posted by the ISSP. Looking from the Measurement's perspective, a Register uniquely identifies each Measurement. For the look up table implementation, a Standard Template Library (STL) Map can be used. FIG. 7F illustrates an example class diagram for an ISSS 700F.

Typical inline research and development parametric test systems may acquire millions of measurements during the lot-run. Most production part types running on inline parametric test systems have fewer than 1000 registers. In contrast, typical research and development part types can have 10,000 or more registers.

Figure 7G:
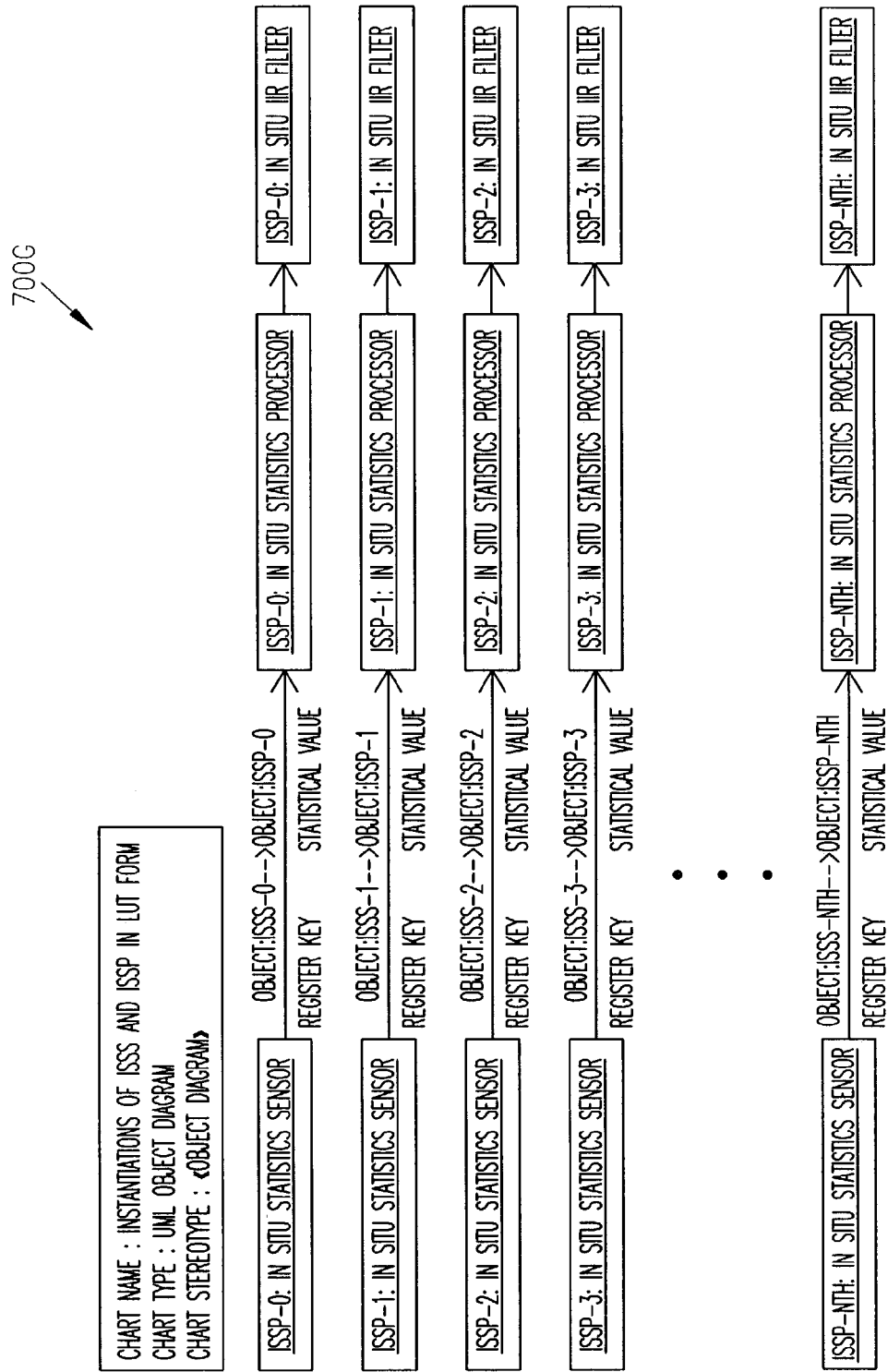

Furthermore, in FIG. 7G, each kind of measurement is uniquely defined by a register. There is a dedicated In Situ Statistics Sensor (ISSS) and In Situ Statistics Processor (ISSP) pair allocated for each Register.

Each time a measurement is acquired from the parametric tester, concurrently, statistics get calculated, filtered, and evaluated with respect to control limits. To prevent excessive triggering, a separate Infinite Response Filter bank is instantiated for each ISSP.

Figure 7H:
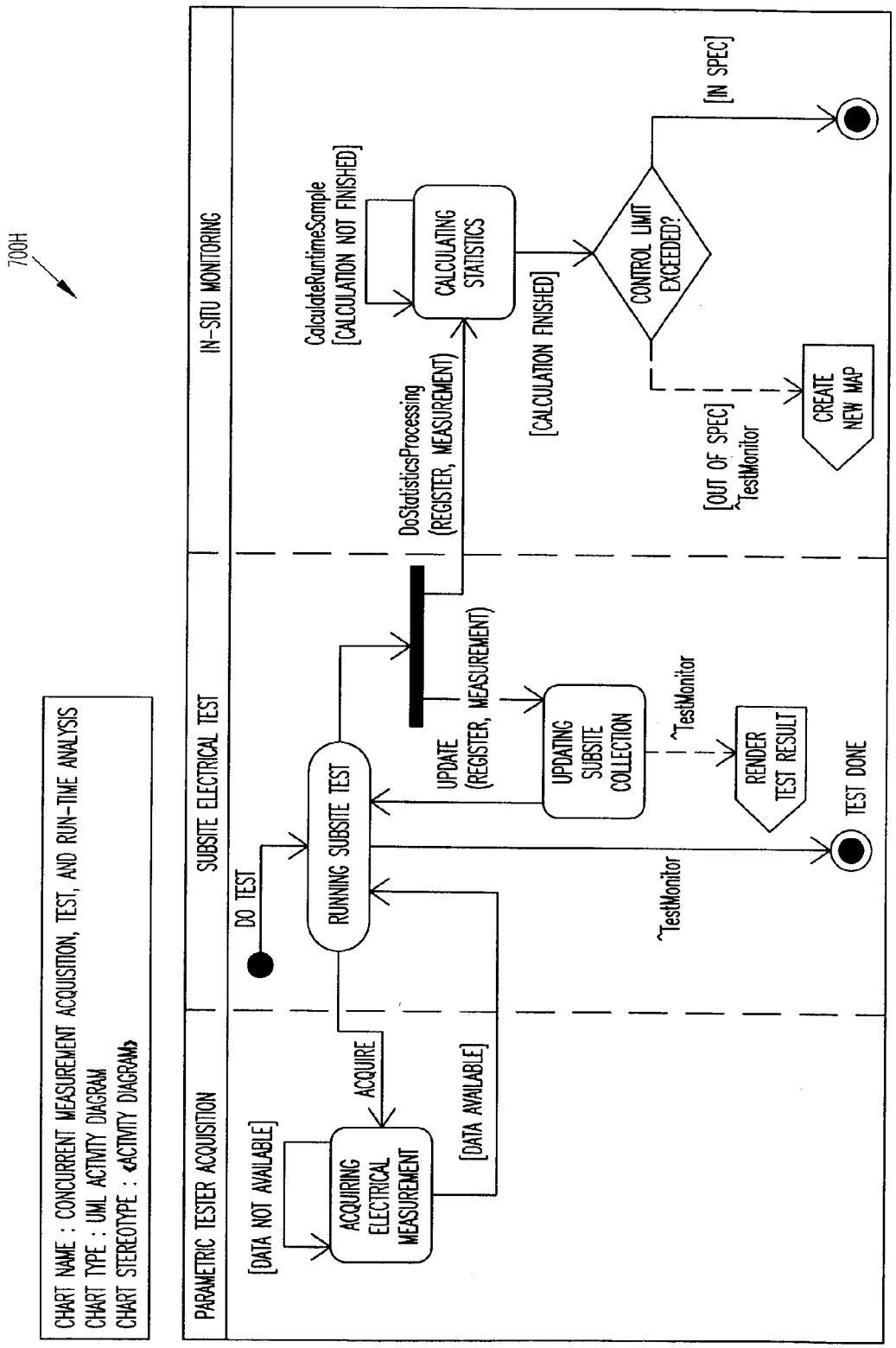
Figures 1, 71:
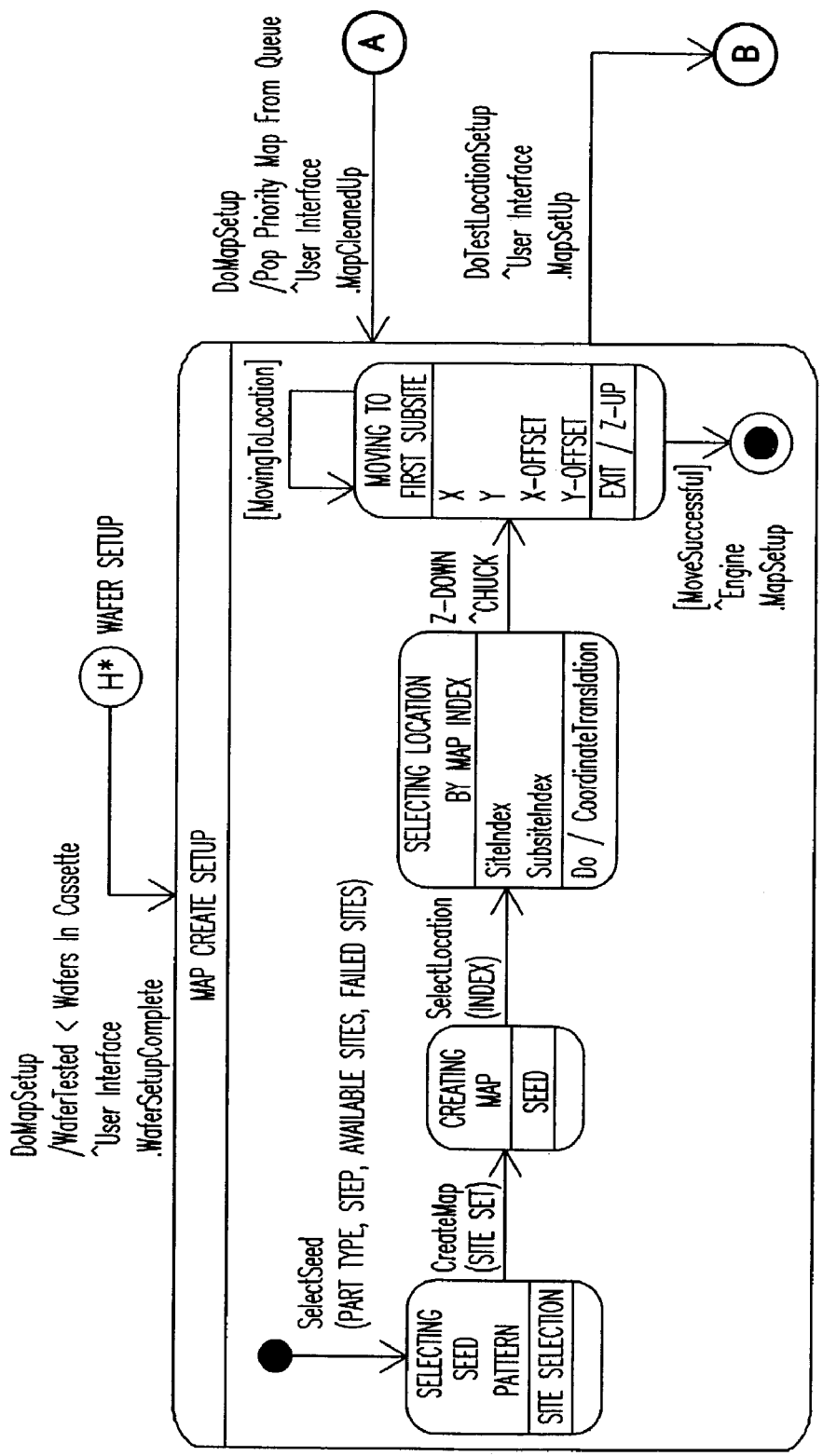
Figures 2, 71:
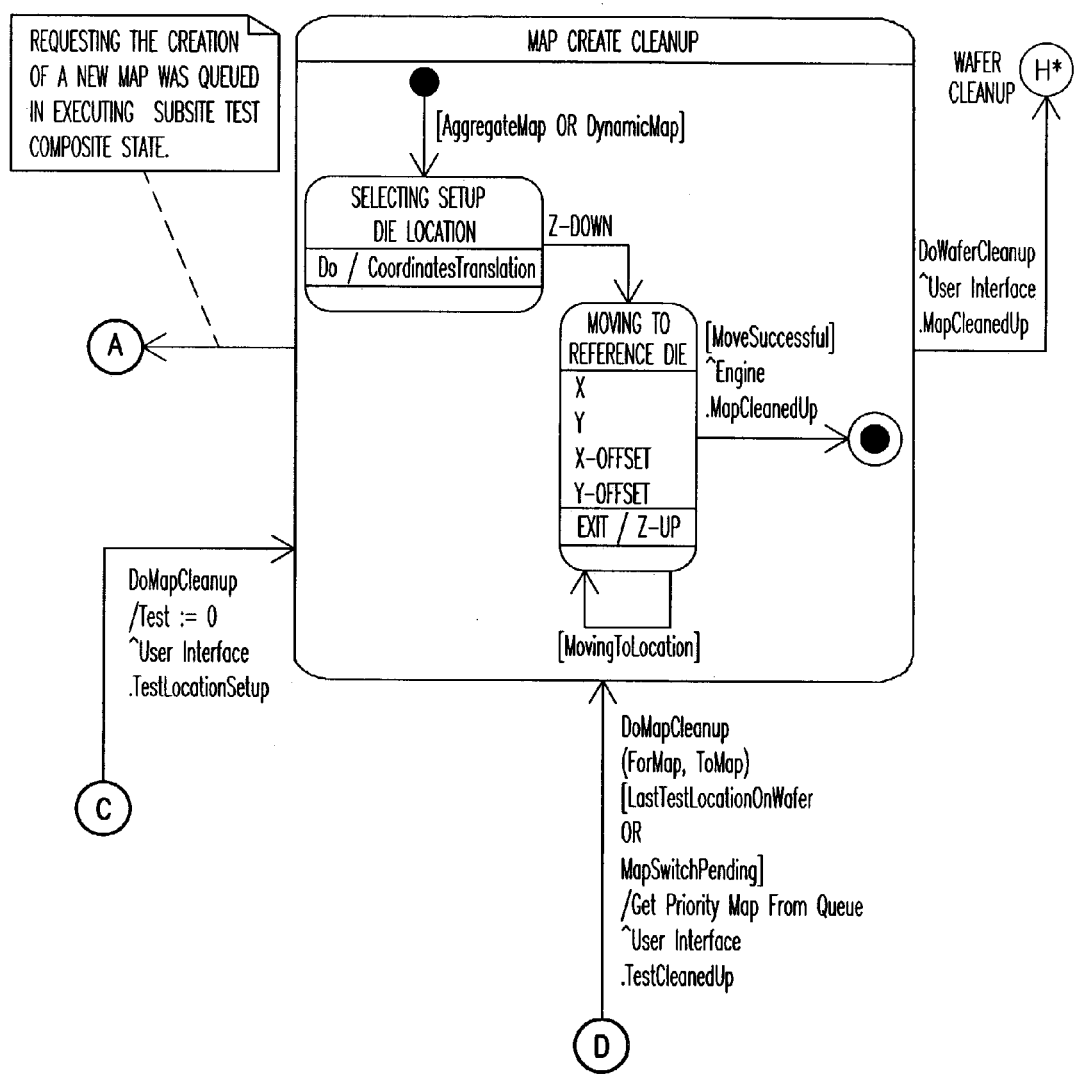
Figures 3, 71:
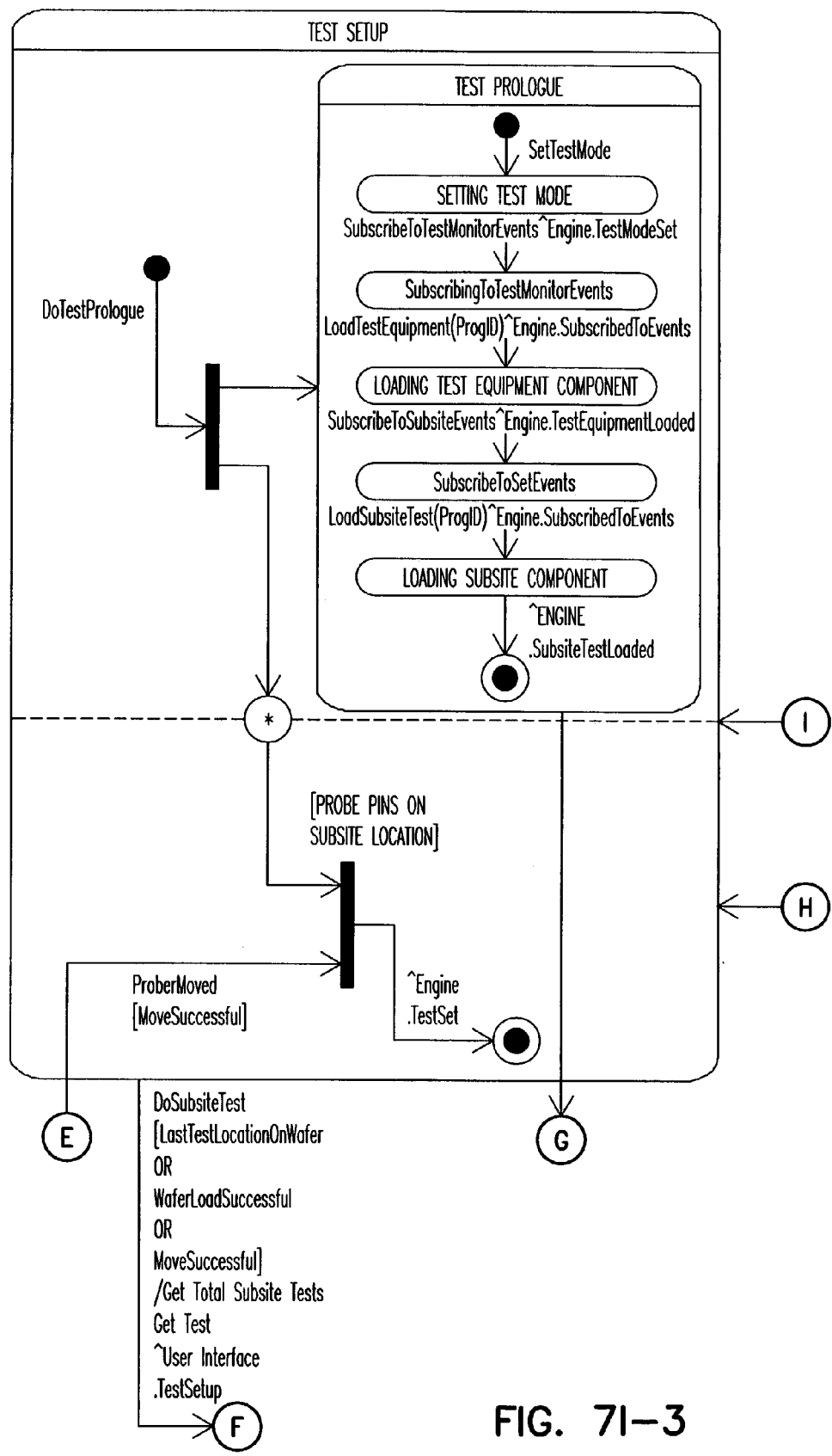
Figures 4, 71:
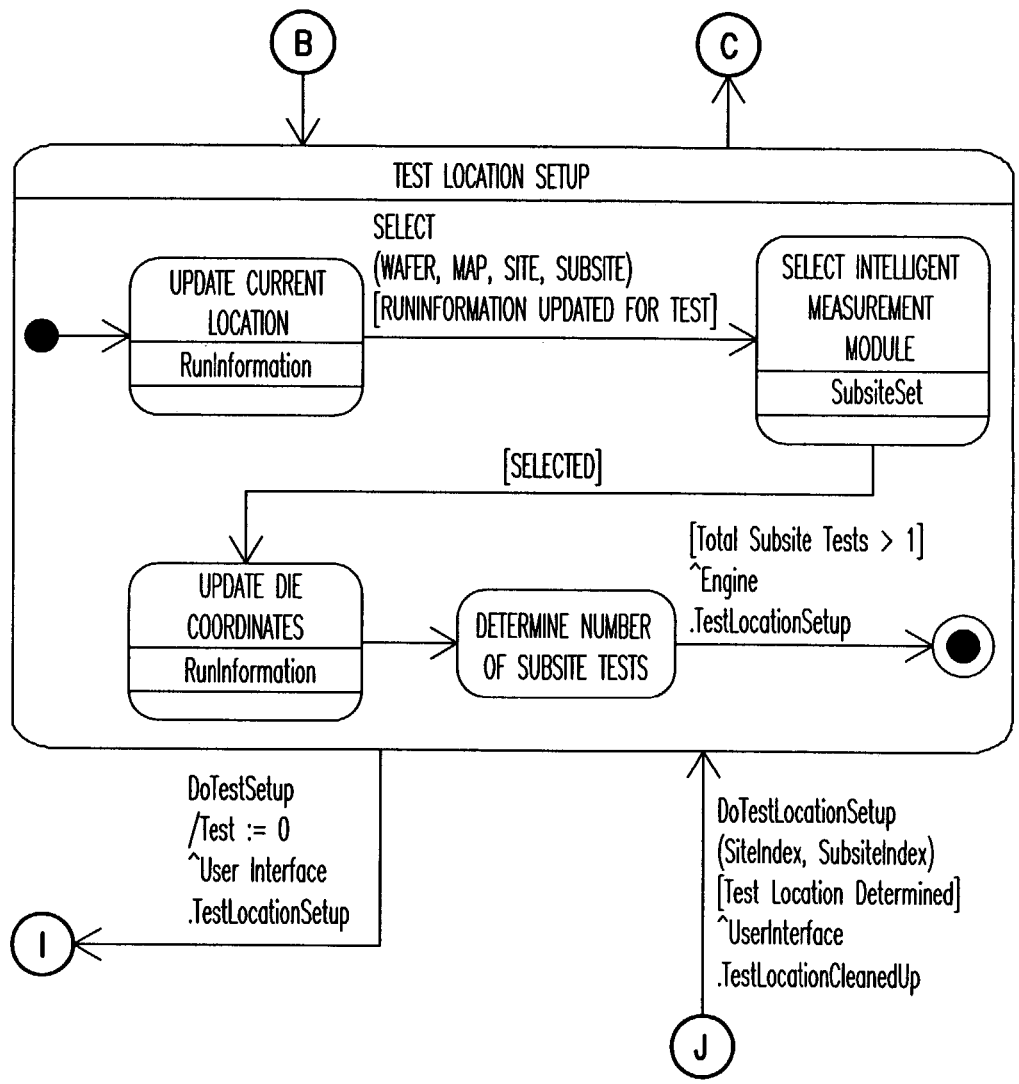
Figures 5, 71:
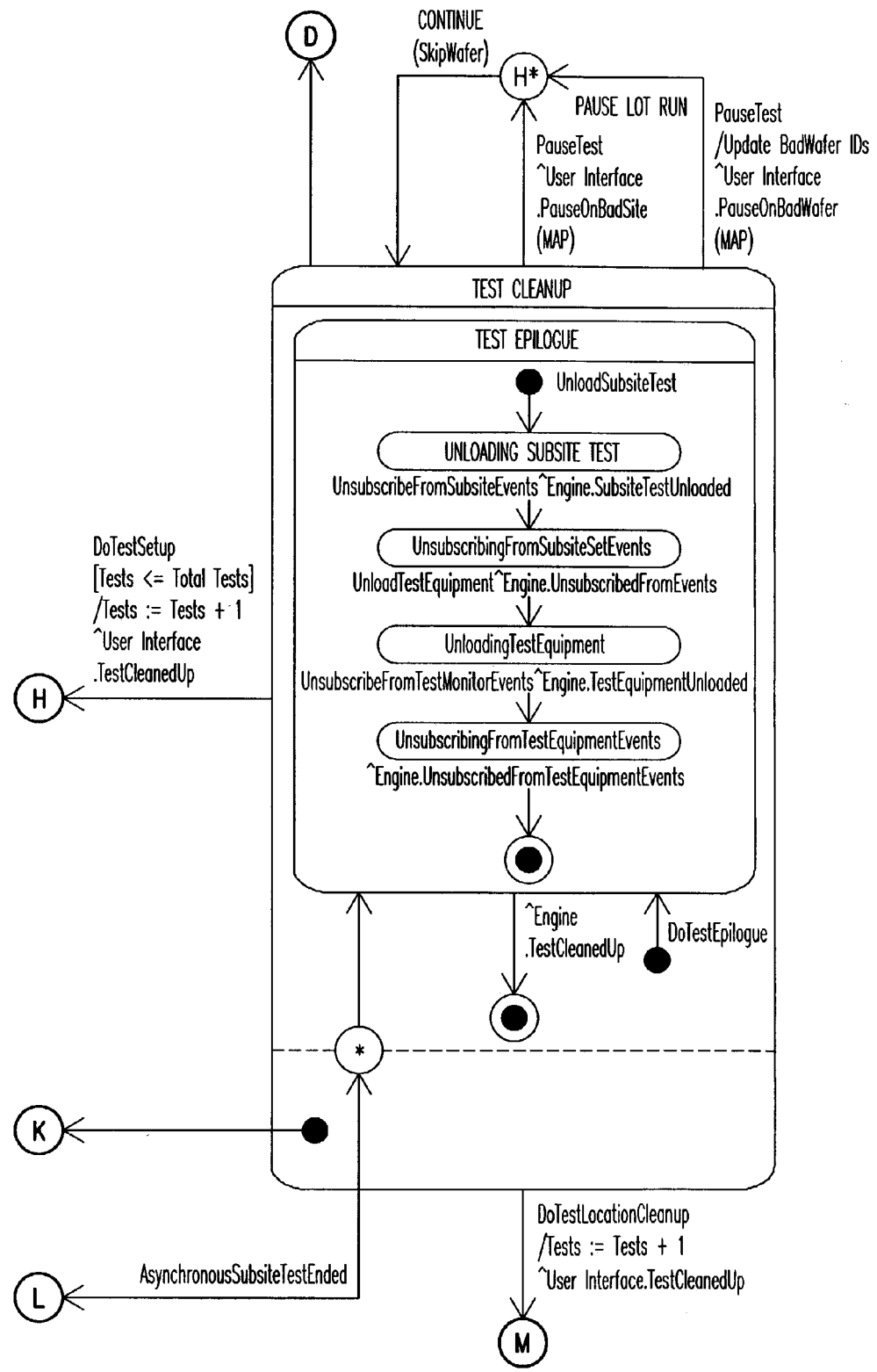
Figures 6, 71:
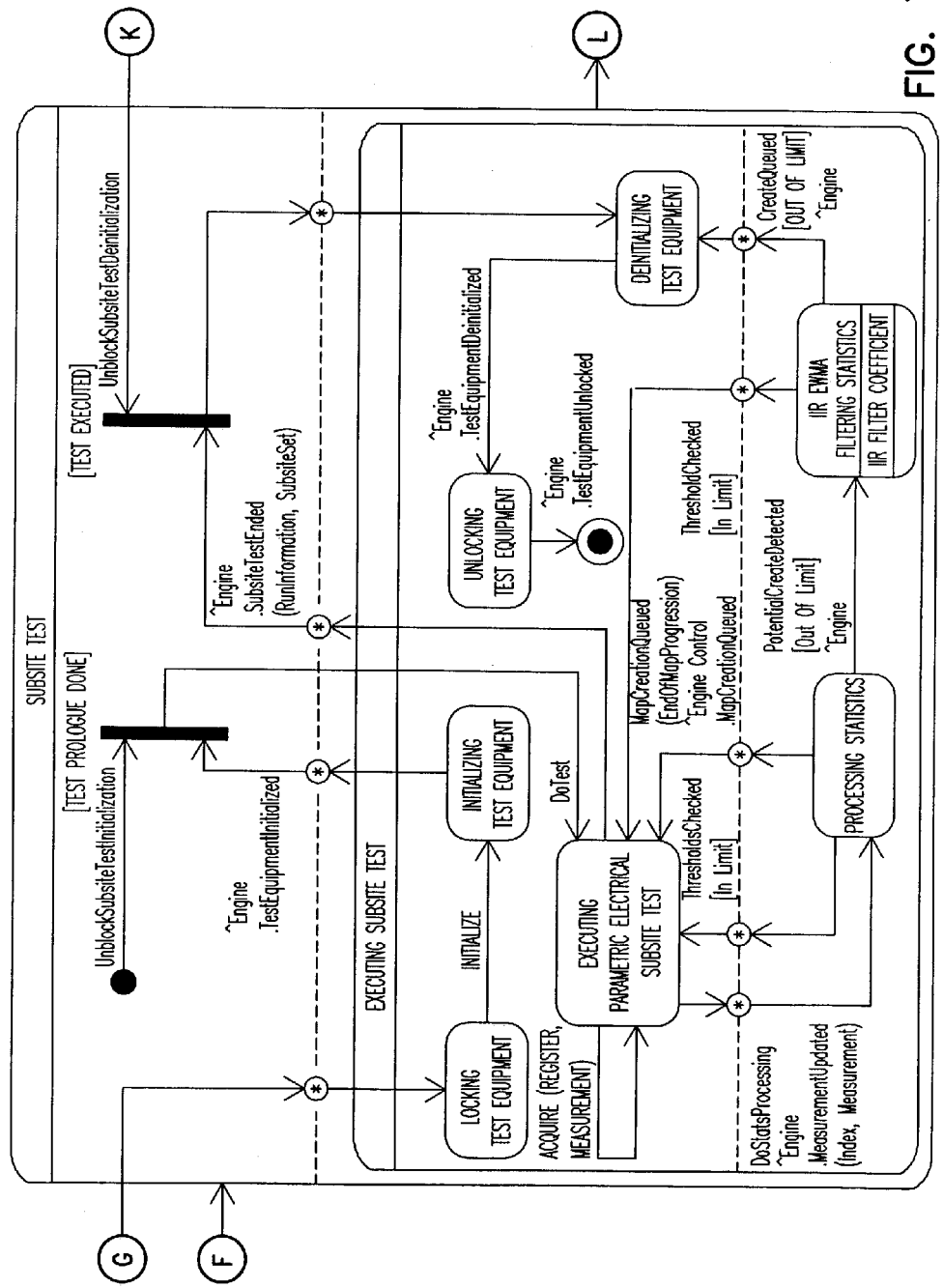
Figures 7, 71:
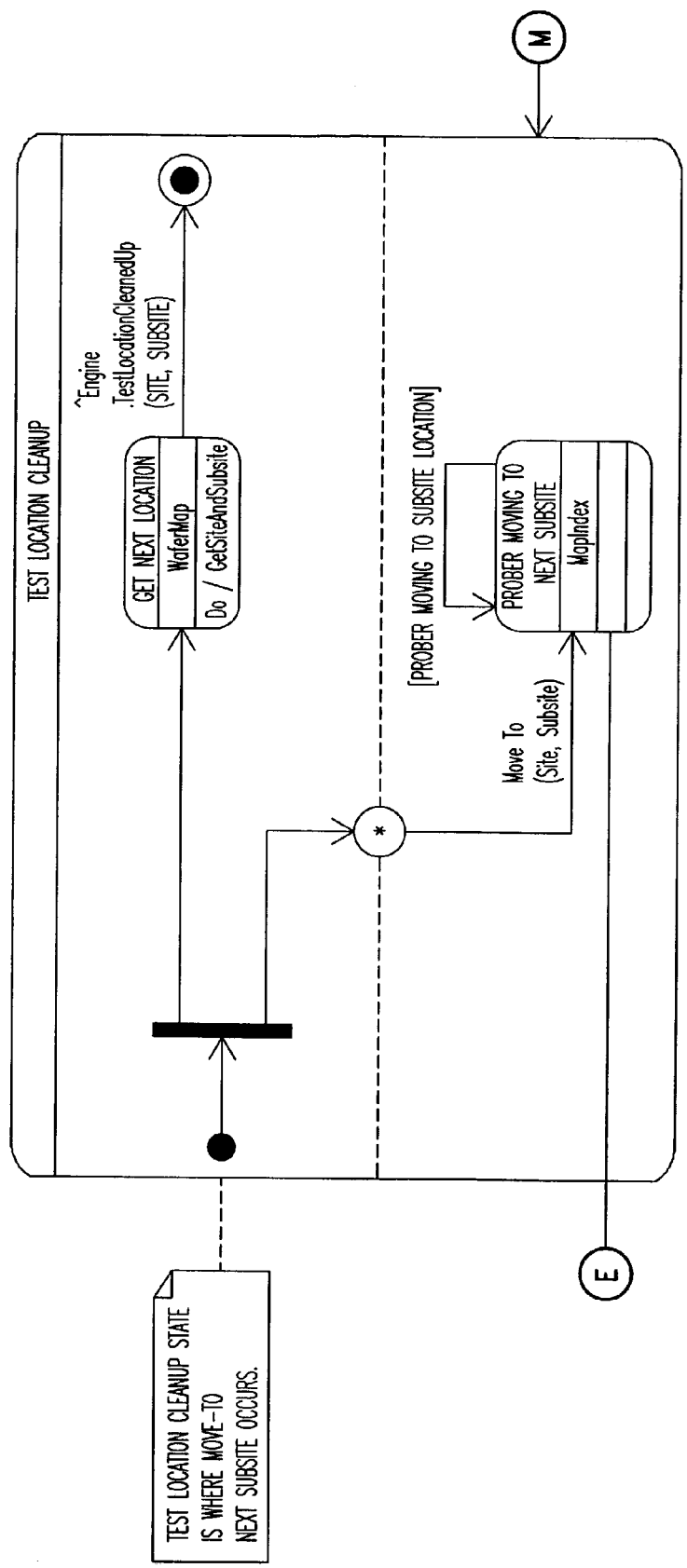

FIG. 7H shows that the time spent updating the sub-site collection, which is mostly bound for graphic card processing, is concurrent with the task of calculating statistics. Only if an upper or lower statically controlled limit is exceeded does an event fire requesting the creation of a new map.

FIG. 7I illustrates an example of composite state diagram governing the CWE 101D of the present invention and is included only for purposes of illustration.

During the SubSite Test Composite State, new map create request may be queued, which will result in a new map creation during Map Create Setup Composite State.

CONCLUSION

Embodiments of the present invention address devices and methods concerning the dynamic creation of wafer test maps based on previous test results and/or seed templates for predefined geometric patterns. In one embodiment, a new wafer map is created while testing a wafer based upon an existing map, and the new wafer map pattern strategy is based on the test data gathered during that test. The new map may be based on patterns that are already stored in the test device (e.g., seed templates).

Other embodiments of the present invention can include map creation based upon test data obtained while a wafer is under test in a wafer test lot. Still other embodiments are directed to various testing circumstances, including parametric testing and probe.

The detailed discussion and examples above demonstrate how dynamic wafer map patterns can be dynamically created and modified to improve wafer testing by emboding a semiconductor engineer's experience and analysis in seed templates, which can be dynamically processed during a lot test session.

What is claimed is:

1. A method for dynamic wafer map creation, comprising:
   testing a wafer using a first test map;
   acquiring one or more candidate patterns during testing;
   identifying a subset of test locations within the wafer that intersect with one or more of the candidate patterns; and
   dynamically creating one or more second test maps based on the one or more patterns and the subset of intersecting test locations for use during a same testing session.

2. The method of claim 1 further comprising, using one or more results associated with testing the wafer with the first test map when creating the one or more second test maps.

3. The method of claim 1 further comprising, dynamically performing tests on the wafer for a number of the one or more second test maps.

4. The method of claim 3 wherein in dynamically performing, a number of the one or more second test maps are queued for subsequent testing.

5. The method of claim 3 further comprising, forming a composite test map from the one or more second test maps.

6. The method of claim 1 wherein in detecting, the one or more patterns include test locations for the wafer that intersect predefined geometric patterns.

7. A method for dynamic wafer map creation, comprising:
   loading a wafer test plan;
   testing a first test map against a wafer;
   obtaining first results;
   determining patterns for additional testing on the wafer by locating a number of test sites defined in the test plan tat intersect a number of predefined seeded patterns associated with one or more second test maps; and
   creating dynamic instances of the one or more second test maps for testing during a same testing session as the first test map by using the located test sites and the first results.

8. The method of claim 7 wherein in obtaining a number of the first results include results obtained from sensors indicating that values associated with the test measurements and results exceed predefined thresholds.

9. The method of claim 7 wherein in creating, the instances of the one or more second test maps include specific tests to be performed on a number of the located test sites of the wafer.

10. The method of claim 7 wherein in testing, the testing is suspended from the first test map based on predefined values dynamically being obtained from the first results, and testing is dynamically switched to one or more of the second test maps.

11. The method of claim 7 further comprising, combining the one or more second test maps into a composite test map.

12. The method of claim 11 further comprising, dynamically testing the wafer using the composite test map.

13. The method of claim 7 further comprising, concurrently testing at least two of the one or more second test maps against the wafer in parallel.

14. The method of claim 7 wherein in creating, a number of the one or more second test maps are selected from a data store of test map templates.

15. A method for dynamic wafer map creation, comprising:
   executing a first test on a wafer using a first test map;
   identifying test sites on the wafer available for testing;
   matching a number of the test sites with patterns associated with one or more second test maps; and
   dynamically executing one or more second tests on the wafer using the one or more second test maps, in response to matching and during a same testing session as the first test.

16. The method of claim 15 wherein in executing, the test sites of the one or more second test maps are tested in a serpentine prober movement pattern.

17. The method of claim 15 wherein in executing, the test sites of the one or more second test maps are tested in a non-serpentine prober movement pattern.

18. The method of claim 15 further comprising, using results associated with the first test with the matching patterns to select the one or more second test maps.

19. A dynamic wafer testing system, comprising:
   a lot of wafers subject to a testing session associated with a test plan;
   a first test map associated with the test plan;
   a number of test sites associated with each of the wafers in the lot and identified in the test plan; and
   a test station controller that initiates testing of the first test map on a first wafer in the lot, and that acquires the test sites identified in the test plan, and wherein the test station controller dynamically identifies a number of additional test maps associated with patterns of the test sites on the first wafer, and dynamically tests the first wafer and the remaining wafers using the additional test maps identified during the same testing session.

20. The dynamic wafer testing system of claim 19, wherein the first test map is dynamically created after analyzing the test plan and comparing a number of test sites in the test plan to a default seed pattern.

21. The dynamic wafer testing system of claim 20, wherein the default seed pattern identifies a percentage of the test sites that are needed on the first wafer and matched to the default seed pattern in order to create the first test map.

22. The dynamic wafer testing system of claim 20, wherein the default seed pattern identifies a checkerboard pattern of test sites that are needed on the first wafer and matched to the default seed pattern in order to create the first test map.

23. The dynamic wafer testing system of claim 19, wherein the patterns are stored and acquired from a data store during the testing session.

24. The dynamic wafer testing system of claim 19, wherein the patterns are dynamically altered based on results of testing the first wafer of the lot.

25. The dynamic wafer testing system of claim 19, wherein while the first wafer in the lot is being tested a next wafer in the lot begins testing in parallel during the testing session.

26. The dynamic wafer testing system of claim 19, wherein testing on the first wafer using the first test map completes before the additional test maps are created and tested against the first wafer and the remaining wafers in the lot.

27. A dynamic wafer testing system, comprising:
a wafer that is subject to testing;
a processor instance;
a sensor instance associated with each test register included within the processor instance; and
wherein during testing of the wafer one of the sensor instances detects a measurement statistic that exceeds a predefined threshold, and based on that event a new wafer test map is dynamically identified and used to continue testing the wafer during a same test session.

28. The dynamic wafer testing system of claim 27, wherein a new wafer test map identifies sites on the wafer for testing and types of testing to be performed on the sites of the wafer.

29. The dynamic wafer testing system of claim 27, wherein the new wafer test map preempts the testing of a previous test map that is processing on the processor instance when the measurement statistic exceeds the predefined threshold.

30. The dynamic wafer testing system of claim 27, wherein the new wafer test map is created by identifying a desired geometric pattern associated with the new wafer test that intersects a desired number of testing sites on the wafer, and wherein the testing sites are identified in a testing plan.

31. A wafer subject to dynamic testing from instructions accessible to a computer-readable medium, where the instructions comprise:
identifying a test plan associated with testing the wafer;
identifying test sites on the wafer from the test plan;
initiating a first test map created from the test plan to begin testing of the wafer; and
dynamically creating one or more second test maps for continued testing of the wafer during a same testing session.

32. The wafer of claim 31 wherein in dynamically creating, the one or more second test maps are identified by dynamic measurement values obtained during testing of the wafer using the first test map.

33. The wafer of claim 31 wherein in initiating the first test map, the first test map is created based on a detected default geometric seeded pattern that can be identified from a number of the test sites that are to be tested on the wafer.

34. The wafer of claim 31 further comprising instructions for suspending the testing of the wafer against the first test map and automatically starting testing that uses one or more of the second test maps when predefined results associated with testing the first test map are detected.

35. The wafer of claim 31 wherein in dynamically creating, a number of the one or more second test maps are identified by matching patterns associated with the test sites of the wafer against patterns included within a data store that identify a number of the one or more second test maps.

* * * * *

UNITED STATES PATENT AND TRADEMARK OFFICE
CERTIFICATE OF CORRECTION

PATENT NO. : 7,010,451 B2
APPLICATION NO. : 10/417640
DATED : March 7, 2006
INVENTOR(S) : Dorough et al.

It is certified that error appears in the above-identified patent and that said Letters Patent is hereby corrected as shown below:

On Sheet 18 of 31, in Fig. 7B (Box. 700B), in line 1, delete "PROGENTOR" and insert -- PROGENITOR --, therefor.

In column 10, line 62, delete "$\{S_{e1} \notin A, S_{e2} \notin A, \ldots, S_{em} \notin A\}$" and insert -- $\{S_{e1} \notin A, S_{e2} \notin A, \ldots, S_{em} \notin A\}$ --, therefor.

In column 11, line 16, delete "$\exists S\langle x_i, y_i \rangle \cap |(S\langle x_i, y_i \rangle \in A \cap S\langle x_i, y_i \rangle \in M)$: *included*" and insert -- $\exists S\langle x_i, y_i \rangle |(S\langle x_i, y_i \rangle \in A \cap S\langle x_i, y_i \rangle \in M)$: *included* --, therefor.

In column 11, line 26, delete "$A : set \subseteq \{\forall S\langle x_i, y_i \rangle \subset M \,|\, (R > R_i > R_e) \rightarrow S \in A\}$" and insert -- $A : set \subseteq \{\forall S\langle x_i, y_i \rangle \subset M \,|\, (R > R_i > R_e) \rightarrow S \in A\}$ --, therefor.

In column 11, line 37, delete
"$\exists S\langle x_i, y_i \rangle | (S\langle x_i, y_i \rangle \in A \cap S\langle x_i, y_i \rangle \in \quad included(R_{i > R_e}) \, M) : $" and insert -- $\exists S\langle x_i, y_i \rangle | (S\langle x_i, y_i \rangle \in A \cap S\langle x_i, y_i \rangle \in M) : included(R_i \leq R_e)$ --, therefor.

In column 11, lines 41-42, delete "$\exists S\langle x_i, y_i \rangle | (S\langle x_i, y_i \rangle \in A \cap S\langle x_i, y_i \rangle \in M) : include$
$\quad ((R_{e1} > R_i > R) \vee (R_i > R_{e2}))$ " and insert -- $\exists S\langle x_i, y_i \rangle | (S\langle x_i, y_i \rangle \in A \cap S\langle x_i, y_i \rangle \in M) : included$
$\quad ((R_{e1} < R_i < R) \vee (R_i < R_{e2}))$ --, therefor.

In column 12, line 3, delete "$\{S_{e1} \notin A, S_{e2} \notin AREA, \ldots, S_{em} \notin A\}$" and insert -- $\{S_{e1} \notin A, S_{e2} \notin AREA, \ldots, S_{em} \notin A\}$ --, therefor.

In column 12, line 12, delete " $|CA| \equiv 29\sqrt{(X_C - X_A)^2 + (Y_C Y_A)^2}$ " and insert -- $|CA| \equiv \sqrt{(X_C - X_A)^2 + (Y_C - Y_A)^2}$ --, therefor.

UNITED STATES PATENT AND TRADEMARK OFFICE
CERTIFICATE OF CORRECTION

PATENT NO. : 7,010,451 B2
APPLICATION NO. : 10/417640
DATED : March 7, 2006
INVENTOR(S) : Dorough et al.

It is certified that error appears in the above-identified patent and that said Letters Patent is hereby corrected as shown below:

In column 12, line 19, delete

"$\exists S\langle x_c, y_c\rangle | (S \in A \cap S \in M) : included((|CA|< R_1) \wedge (|CB| < R_2))$" and insert -- $\exists S\langle x_c, y_c\rangle | (S \in A \cap S \in M) : included((|CA|< R_1) \wedge (|CB| < R_2))$ --, therefor.

In column 12, lines 23-24, delete

"$A : set \subseteq \{\forall S\langle x_i, y_i\rangle \subset M | included((|CA| < R_1) \wedge (|CB| < R_2) \rightarrow S\langle x_i, y_i\rangle \in A\}$" and insert -- $A : set \subseteq \{\forall S\langle x_i, y_i\rangle \subset M | included((|CA| < R_1) \wedge (|CB| < R_2) \rightarrow S\langle x_i, y_i\rangle \in A\}$ --, therefor.

In column 14, lines 24-25, delete "Reprogrammable" and insert -- Re-programmable --, therefor.

In column 20, line 10, in Claim 7, delete "tat" and insert -- that --, therefor.

Signed and Sealed this

Ninth Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,010,451 B2
APPLICATION NO. : 10/417640
DATED : March 7, 2006
INVENTOR(S) : Dorough et al.

It is certified that error appears in the above-identified patent and that said Letters Patent is hereby corrected as shown below:

On Sheet 18 of 31, in Fig. 7B (Box. 700B), in line 1, delete "PROGENTOR" and insert -- PROGENITOR --, therefor.

In column 10, line 62, delete " $\{S_{e1} \notin A, S_{e2} \notin A, ..., S_{em} \notin A\}$ " and insert -- $\{S_{e1} \notin A, S_{e2} \notin A, ..., S_{em} \notin A\}$ --, therefor.

In column 11, line 16, delete " $\exists S\langle x_i, y_i \rangle \cap | (S\langle x_i, y_i \rangle \in A \cap S\langle x_i, y_i \rangle \in M):$ $included$"

and insert -- $\exists S\langle x_i, y_i \rangle | (S\langle x_i, y_i \rangle \in A \cap S\langle x_i, y_i \rangle \in M):$ $included$ --, therefor.

In column 11, line 26, delete " $A: set \underline{\subseteq} \{\forall S\langle x_i, y_i \rangle \subset M | (R > R_i > R_t) \to S \in A\}$ " and insert -- $A: set \subseteq \{\forall S\langle x_i, y_i \rangle \subset M | (R > R_i > R_t) \to S \in A\}$ --, therefor.

In column 11, line 37, delete " $\exists S\langle x_i, y_i \rangle | (S\langle x_i, y_i \rangle \in A \cap S\langle x_i, y_i \rangle \in M):$ $included$ $(R_{i > R_t})$ " and insert -- $\exists S\langle x_i, y_i \rangle | (S\langle x_i, y_i \rangle \in A \cap S\langle x_i, y_i \rangle \in M):$ $included(R_i \leq R_3)$ --, therefor.

In column 11, lines 41-42, delete " $\exists S\langle x_i, y_i \rangle | (S\langle x_i, y_i \rangle \in A \cap S\langle x_i, y_i \rangle \in M):$ $included$" and insert
$((R_{e1} > R_i > R) \vee (R_i > R_{e2}))$ -- $\exists S\langle x_i, y_i \rangle | (S\langle x_i, y_i \rangle \in A \cap S\langle x_i, y_i \rangle \in M):$ $included$ --, therefor.
$((R_{e1} < R_i < R) \vee (R_i < R_{e2}))$ In column 12, line 3 delete " $\{S_{e1} \notin A, S_{e2} \notin AREA, ..., S_{em} \notin A\}$ " and insert -- $\{S_{e1} \notin A, S_{e2} \notin AREA, ..., S_{em} \notin A\}$ --, therefor.

In column 12, line 12, delete " $|CA| \equiv 29\sqrt{(X_C - X_A)^2 + (Y_C Y_A)^2}$ " and insert -- $|CA| \equiv \sqrt{(X_C - X_A)^2 + (Y_C - Y_A)^2}$ --, therefor.

UNITED STATES PATENT AND TRADEMARK OFFICE
CERTIFICATE OF CORRECTION

PATENT NO. : 7,010,451 B2
APPLICATION NO. : 10/417640
DATED : March 7, 2006
INVENTOR(S) : Dorough et al.

It is certified that error appears in the above-identified patent and that said Letters Patent is hereby corrected as shown below:

In column 12, line 19, delete " $\exists S\langle x_c, y_c\rangle | (S \in A \cap S \in M) : included((|CA| < R_1) \wedge (|CB| < R_2))$ "

and insert -- $\exists S\langle x_c, y_c\rangle | (S \in A \cap S \in M) : included((|CA| < R_1) \wedge (|CB| < R_2))$ --, therefor.

In column 12, lines 23-24, delete

" $A : set \subseteq \{\forall S\langle x_i, y_i\rangle \subset M | included((|CA| < R_1) \wedge (|CB| < R_2) \rightarrow S\langle x_i, y_i\rangle \in A\}$ "

and insert -- $A : set \subseteq \{\forall S\langle x_i, y_i\rangle \subset M | included((|CA| < R_1) \wedge (|CB| < R_2) \rightarrow S\langle x_i, y_i\rangle \in A\}$ --, therefor.

In column 14, lines 24-25, delete "Reprogrammable" and insert -- Re-programmable --, therefor.

In column 20, line 10, in Claim 7, delete "tat" and insert -- that --, therefor.

Signed and Sealed this

Twenty-third Day of December, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,010,451 B2 | Page 1 of 1 |
| APPLICATION NO. | : 10/417640 | |
| DATED | : March 7, 2006 | |
| INVENTOR(S) | : Michael J. Dorough et al. | |

It is certified that error appears in the above-identified patent and that said Letters Patent is hereby corrected as shown below:

This certificate vacates the Certificate of Correction issued December 23, 2008. The certificate is a duplicate of the Certificate of Correction issued December 9, 2008. All requested changes were included in the Certificate of Correction issued December 9, 2008.

Signed and Sealed this

Third Day of February, 2009

JOHN DOLL
*Acting Director of the United States Patent and Trademark Office*